United States Patent [19]
Ghoshal et al.

[11] Patent Number: 6,118,284
[45] Date of Patent: Sep. 12, 2000

[54] HIGH SPEED MAGNETIC FLUX SAMPLING

[76] Inventors: Uttam S. Ghoshal; Snigdha Ghoshal, both of 10421 Indigo Broom Loop, Austin, Tex. 78758

[21] Appl. No.: 08/943,218

[22] Filed: Oct. 6, 1997

Related U.S. Application Data

[60] Provisional application No. 60/027,526, Oct. 4, 1996.

[51] Int. Cl.$^7$ .......................... G01R 31/315; G01R 31/28
[52] U.S. Cl. ............................................. 324/750; 324/765
[58] Field of Search .................................. 324/750, 753, 324/765, 529, 252

[56] References Cited

U.S. PATENT DOCUMENTS

| | | | |
|---|---|---|---|
| 3,992,663 | 11/1976 | Seddick | 324/244 |
| 4,186,338 | 1/1980 | Fichtenbaum | 324/529 |
| 4,517,511 | 5/1985 | Suto | 324/529 |
| 5,465,046 | 11/1995 | Campbell et al. | 324/529 |

*Primary Examiner*—Ernest Karlsen

[57] ABSTRACT

A system for measuring magnetic fields produced by an integrated circuit device-under-test includes a clock generator configured to generate a clock signal, a delay circuit configured to generate a delayed clock signal having a known delay relative to the clock signal, a pulse generator configured to generate a series of pulses having a frequency corresponding to a frequency of the clock signal, the pulses of the series of pulses being offset from the clock signal by the known delay, and a sensor having a property that varies in response to a magnetic field at the sensor. A sampling circuit connected to the sensor and to the pulse generator is configured to measure the property of the sensor at times corresponding to pulses of the series of pulses, and to produce a sampling signal having, for each pulse, a first value (e.g., a logical one) when the property of the sensor indicates that the magnetic field at the sensor exceeds a threshold amount and a second value (e.g., a logical zero) when the property of the sensor indicates that the magnetic field at the sensor does not exceed the threshold amount. A digital filter is connected to the sampling circuit and configured to produce a first indicator when a number of first values in the sampling signal exceeds a predetermined amount and to produce a second indicator when a number of first values in the sampling signal does not exceed a predetermined amount. A counter connected to the digital filter is configured to increment an output signal in response to one of the first and second indicators and to decrement the output signal in response the other of the first and second indicators. A feedback loop including a digital-to-analog converter is connected to the counter and configured to produce an electrical signal proportional to the output signal, the electrical signal causing the feedback loop to produce a feedback magnetic field in proportion to the output signal, the feedback magnetic field being a component of the magnetic field at the sensor. The output signal of the counter corresponds to a magnetic field produced by the device-under-test.

9 Claims, 17 Drawing Sheets

6,118,284

HIGH SPEED MAGNETIC FLUX SAMPLING

CROSS REFERENCE TO RELATED APPLICATION

This application claims priority from U.S. Provisional Application No. 60/027,526, filed Oct. 4, 1996, and entitled HIGH-SPEED FLUX SAMPLING MICROSCOPE, which is incorporated by reference.

TECHNICAL FIELD

The invention relates to characterizing time-varying currents and magnetic fields in microscopic structures and integrated circuits.

BACKGROUND

Magnetic field sensors for use in measuring static (time-invariant) magnetic fields are known. Types of sensors include semiconductor Hall effect sensors, magnetoresistive sensors in magnetic materials, magnetic force microscopes, magnetostatic delay lines, and superconducting quantum interference device (SQUID) sensors. At low bandwidths (e.g., less than 10 kHz), Hall effect magnetic field sensors may be used to provide measurement with sensitivity on the order of 10–100 microteslas. Magnetoresistive thin film materials may be used to construct sensitive magnetic field sensors for detecting magnetic fields in the nanotesla range at room temperature (e.g., 300 K). Magnetoresistive sensors are described, for example, in U.S. Pat. No. 5,247,278, "Magnetic Field Sensing Device" and U.S. Pat. No. 5,500,590, "Apparatus for Sensing Magnetic Fields Using a Coupled Film Magnetoresistive Transducer". These sensors are based on anisotropic magnetoresistance (AMR) materials such as permalloy, which exhibit a 2–4% change in resistance per oersted (79.58 A/m) of magnetic field. Products such as the HMC 1001 from Honeywell produce 15 $\mu$V output signals in response to 100 nT (nanotesla) magnetic fields. The output signal voltage of these magnetoresistive sensors are amplified to millivolt/volt signals using low-noise amplifiers. In general, the use of these sensitive magnetoresistive elements has been limited to detection of static or slowly varying magnetic fields. High speed sensing has been prevented by the limited bandwidth of the amplification stages and the large thermal noise voltage of the magnetoresistive sensing element.

Magnetic force microscopy, such as is described in U.S. Pat. No. 5,465,046, "Magnetic Force Microscopy Method and Apparatus to Detect and Image Currents in Integrated Circuits", relies on force exerted by a current of an integrated circuit on a miniature cantilevered magnetic tip. The intrinsic bandwidths are very low (e.g., less than 100 kHz) because they are limited by the mechanical resonant frequencies (e.g., 22 kHz) of the cantilever. The low damping rate of the mechanical resonance of the cantilever also limits the spatial scanning rate, and the site-to-site scanning rate is on the order of milliseconds.

Magnetostatic delay lines, such as are described in U.S. Pat. No. 4,926,116, "Wide Band Large Dynamic Range Current Sensor and Method of Current Detection Using Same", have high bandwidths, and generally have low spatial resolution. This is because a delay line generally has to be long (on the order of a few centimeters) for appreciable field sensitivities (e.g., a 1% change in delay for 1 oersted of magnetic field).

At present, superconductive quantum interference devices (SQUIDs) appear to have the best magnetic field sensitivity and the best field resolution (picotesla range) of devices known in the art. They have been used in a variety of scanning microscope applications for characterizing magnetic fields in microscopic structures. Although the sensitivity and noise properties of the SQUID microscopes are much better than magnetoresistive transducers, they require cryogenic operation and the SQUID loop cannot be brought in close proximity (for example, 10 $\mu$m) to room temperature samples. The low temperature operation of the SQUIDs reduces the temperature of the sample and affects its performance. Since magnetic fields decay in a manner inversely proportional to the square of the distance between the structure under test and the SQUID sensing loop, this spacing requirement may result in significant loss of magnetic field resolution.

Magnetic field sensors may be used in characterization of complementary metal oxide semiconductor (CMOS) integrated circuits. Typically, CMOS integrated circuit power supply current is in the nanoampere range when there are no logic transitions and the clock is inactive. This low quiescent power supply current, known as $I_{DDQ}$, is used to identify defects and reliability failure mechanisms. $I_{DDQ}$ increases the fault coverage of logic circuits by easily detecting simple stuck-at-faults (SAF), logically redundant SAFs and multiple SAFs. Conventional methods using scan registers require hundreds of patterns to detect the faulty responses in a complex microprocessor chip. The number of test vectors necessary to obtain fault coverage greater than 95% is very large. This significantly increases test and debugging time. $I_{DDQ}$ also permits detection of CMOS defects such as gate-oxide shorts, shifted transistor thresholds, bridges, and transmission gate faults.

As the channel lengths of CMOS transistors are scaled to the 50–100 nm regime, the voltage supply levels are being scaled down to 1–1.5 V to maintain the same channel electric fields and to lower power dissipation. To increase the current drive and speed, the threshold voltages are also being scaled down below 0.3 V. Low threshold voltages increase the transistor subthreshold leakage current dramatically (for example, 10–100× increase when CMOS channel lengths are scaled from 0.25 $\mu$m to 0.1 $\mu$m). This results in large currents at the supply pins, which may mask the increase in $I_{DDQ}$ currents due to defects and negate many of the advantages of $I_{DDQ}$ testing.

SUMMARY

The invention provides techniques for nondestructive evaluation of conductor structures and imaging of magnetic fields in microstructures. Applications of the techniques may vary from measurement of electromagnetic radiation levels, to characterization of neuron response in biological samples, to imaging of signals in integrated circuits. For example, the technique may be used in testing internal operation of high-speed VLSI ("very large scale integrated") circuits and high-frequency RF ("radio frequency") circuits.

The technique may be implemented using a high speed flux sampling microscope ("FSM") to characterize high-speed time-varying current signals in VLSI circuits and to evaluate multilevel VLSI interconnections and multichip module ("MCM") interconnections. The transient noninvasive current measurements can locate at-speed timing errors in complex digital circuits, crosstalk currents in buses, clock faults, supply-voltage noise in output buffers, currents in LC oscillators for RF circuits, and other problems encountered in VLSI circuit testing.

The magnetic field strength at a distance of 10 $\mu$m around a typical VLSI interconnection with dimensions of 0.5×0.5

$\mu m^2$ and carrying 0.1–1 mA of current is in the range of 20–200 mOe (1.6–16 A/m or field induction of 2–20 $\mu$T). The field decays sharply to the nT range at distances of 500 $\mu$m. This suggests that field resolution of 10–100 nT is needed for proper characterization of fields in integrated circuits.

The FSM provides a high-speed, noninvasive and non-destructive scanning probe technique for characterization of microampere currents and nanotesla magnetic fields in microscopic structures and integrated circuits operating at room temperature. To this end, the FSM uses magnetoresistive sensing elements and a closed-loop time sampling technique combined with digital filter circuits to achieve high sensitivities at multigigahertz bandwidths. The feedback and the closed loop operation removes nonlinearities in the magnetoresistive sensor response and the sampling circuits. The digital filter circuits average signals to remove random fluctuations and thermal noise in the sensor and the sampling circuits. As a result, the FSM is able to provide nanotesla field sensitivities at 100 ps time scales.

The use of conventional magnetoresistive elements described in the prior art have been limited to detection of static or slowly varying magnetic fields. High speed sensing is prevented by the limited bandwidth of the amplification stages necessary to boost the 15 $\mu$V signals to detectable levels (e.g., 100 mV). For example, if a gain of 2000 at a bandwidth of 1 GHz is needed, the gain-bandwidth product of the low-noise amplifier is in the THz range, which is unrealizable in state-of-the-art electronics. The large thermal noise voltage in the magnetoresistive sensing element and the amplifier stages also increases considerably at high frequencies.

FSM uses magnetoresistive sensors to sense the local field, and directly samples the signal response at multi-gigahertz bandwidths using the current/magnetic flux mode superconductive circuits without the need of voltage amplification prior to sampling. Furthermore, the sampled signals are filtered to remove effects of thermal noise and random fluctuations using current/flux mode superconductive digital circuits without the need of preamplification. Finally, the signals are amplified to 1V levels at low speeds for the less critical feedback and digital data read-out circuits. FSM completely solves the problems faced by conventional magnetoresistive sensors.

The FSM uses a scanning probe mechanism with magnetoresistive sensors to scan the magnetic fields across a chip. The scanning probe arrangement used by the FSM can provide submicron spatial resolution. FSMs can be used to non-destructively evaluate currents in the supply and ground lines of subcircuits or small logic blocks. The spatial resolution and sensitivity of the FSM provides direct observability of $I_{DDQ}$ currents even if the subthreshold currents are large. By looking at one or few logic blocks at a time and using the high resolution oversampling mode, $I_{DDQ}$ currents due to defects and/or faults can be detected. Furthermore, the location of the fault can be pin-pointed for accurate diagnosis. The limitations of applying traditional $I_{DDQ}$ methods to advanced CMOS ICs, such as excessive leakage currents, can be overcome by detecting currents through the supply ports of subcircuits and standard cells.

Electromigration and many other transistor failure mechanisms also depend directly on the currents or current densities in the interconnections and transistors. Presently, they are detected by accelerated failure tests which are invasive and affect the manufacturing yield. Thus, FSMs can become an important tool for enhancing IC yield by predicting the current density "hot spots". Latch-up in CMOS circuits also can be characterized by analyzing the currents in the wells and the substrate.

The FSM may be employed using test structures and methodology to measure time-varying currents in VLSI circuits. The FSM may perform $I_{DDT}$ testing, which is the measurement and characterization of transient currents through the transistor circuits and interconnections. Just as $I_{DDQ}$ testing detects static faults, $I_{DDT}$ testing can detect various types of dynamic faults which occur in high-speed VLSI. The FSM is an ideal instrument for characterizing $I_{DDT}$ testing problems.

Most high-performance VLSI circuits are based on dynamic logic circuits with precharged nodes and clocked static circuits. In the conventional approach, test patterns are scanned into the data latches, evaluated by the combinational block, and then scanned out from the output latches. The resulting patterns are compared to the expected pattern, and faults are detected. This method does not diagnose or locate dynamic faults within the combinational logic circuit, especially in the case of redundant and multiple faults. Moreover, the clocks and the supply/ground ports are not testable. FSMs can use $I_{DDT}$ testing methods to accurately diagnose and locate both static and dynamic faults. It is also possible to test circuits "on-the-fly" without the use of scan latches and without stopping the clock. Various other schemes for probing voltage of internal nodes are possible. The ability to non-invasively probe voltages of logic nodes and drain currents of transistors at high-speed is vital to detecting at-speed timing errors through the data and control paths. It will also be easy to debug the performance of critical paths in the design while the system is functioning at speed.

Characterization of self and mutual inductances in interconnection structures are becoming increasing important in gigahertz microprocessor designs. Such inductances affect the delay and the characteristics of cross talk voltages. By providing images of signal currents and image currents in the ground return path, the FSM can aid designers to model and predict performance accurately. Characterizing current transients and LdI/dt noise in the power/ground/clock distribution networks within the VLSI and high-performance chip/computer packages are another important application of $I_{DDT}$ testing by FSM. The current surges create inductive voltage drops, which result in dynamic glitches and improper functionality of the VLSI circuit. This is especially easy for the FSM because these global wires are distributed using the upper wiring layers, and because the magnitude of the currents/magnetic fields are relatively large. For mixed signal applications, substrate currents and RF fields in on-chip inductors and resonators can be imaged by FSM. FSMs can also be used to detect current profiles in output buffers, package leads and thereby characterize the package performance accurately.

In one general aspect, the invention features a system for measuring magnetic fields produced by an integrated circuit device-under-test. The system includes a clock generator configured to generate a clock signal for the device-under-test, a delay circuit connected to the clock generator and configured to generate a delayed clock signal having a known delay relative to the clock signal, a pulse generator connected to the delay circuit and configured to generate a series of pulses having a frequency corresponding to a frequency of the clock signal, the pulses of the series of pulses being offset from the clock signal by the known delay, and a sensor having a property that varies in response to a magnetic field at the sensor. A sampling circuit connected to the sensor and to the pulse generator is configured to measure the property of the sensor at times corresponding to pulses of the series of pulses, and to produce a sampling signal having, for each pulse, a first value (e.g., a logical one) when the property of the sensor indicates that the magnetic field at the sensor exceeds a threshold amount and a second value (e.g., a logical zero) when the property of the sensor indicates that the magnetic field at the sensor does not exceed the threshold amount. A digital filter is connected to the sampling circuit and configured to produce a first indicator when a number of first values in the sampling signal exceeds a predetermined amount and to produce a second indicator when a number of first values in the sampling signal does not exceed a predetermined amount. A counter connected to the digital filter is configured to increment an output signal in response to one of the first and second indicators and to decrement the output signal in response the other of the first and second indicators. A feedback loop including a digital-to-analog converter is connected to the counter and configured to produce an electrical signal proportional to the output signal, the electrical signal causing the feedback loop to produce a feedback magnetic field in proportion to the output signal, the feedback magnetic field being a component of the magnetic field at the sensor. The output signal of the counter corresponds to a magnetic field produced by the device-under-test.

Embodiments may include one or more of the following features. The threshold value used by the sampling circuit may correspond to zero magnetic flux.

The series of pulses may include 2N plus 1 pulses and the digital filter may be configured to produce the first indicator when the sampling signal includes more than N occurrences of the first value.

The sensor may be mounted on a scanning probe configured to position the sensor relative to the device-under-test. The feedback loop may include a portion mounted on the scanning probe to move with the sensor and generate the feedback magnetic field at the sensor. The scanning probe may include a flexible substrate on which the sensor is mounted, and the sensor may constitute the tip of the scanning probe.

The sensor may be a magnetoresistive sensor having an electrical resistance that varies in response to the magnetic field at the sensor. The sensor and the sampling circuit may be implemented, with or without the digital filter, on a single integrated circuit chip. The sensor may be a single magnetoresistive sensor placed between magnetic thin film flux-concentrators that focus the magnetic field at the sensor onto the magnetoresistive sensor. The sensor also may include four magnetoresistive sensors forming a Wheatstone bridge.

A coil may be connected to the sensor, and the sampling circuit may be superconductive sampling circuit configured to sense a magnetic field produced in the coil. The digital filter may be a superconductive digital filter, and the superconductive sampling circuit and the superconductive digital filter may operate under cryogenic conditions. When the sampling circuit is operated under cryogenic conditions, the magnetic coupling provided by the coil permits the device-under-test to be operated at room temperature.

An amplifier may be connected to the sensor. The sampling circuit may be a semiconductor sampling circuit configured to sample a signal produced by the amplifier.

In another general aspect, the invention features a system for measuring magnetic fields. The system includes a sensor having a property that varies in response to a magnetic field at the sensor, a pulse generator configured to generate a series of pulses, and a sampling circuit connected to the sensor and to the pulse generator. The sampling circuit is configured to measure the property of the sensor at times corresponding to pulses of the series of pulses. A feedback loop is configured to produce a feedback magnetic field in response to the measurement by the sampling circuit. The feedback magnetic field is a component of the magnetic field at the sensor. An output circuit is configured to produce an output signal in response to the measurement by the sampling circuit. The output signal corresponds to a difference between the magnetic field at the sensor and the feedback magnetic field.

Embodiments may include one or more of the features discussed above. In addition, the sampling circuit may be configured to produce a digital sampling signal having a first value when the magnetic field at the sensor exceeds a threshold value and having a second value when the magnetic field at the sensor does not exceed the threshold value. A digital filter may be configured to produce a first indicator when the sampling circuit produces a digital sampling signal having a predetermined number of first values in response to the series of pulses and a second indicator when the digital sampling signal has less than the predetermined number of first values. The output circuit may be a counter configured to produce a count value as the output signal, to increment the count value when the digital filter produces the first indicator, and to decrement the count value when the digital filter produces the second indicator.

In another general aspect, the invention features producing a feedback magnetic field at a position of interest on the device-under-test, the feedback magnetic field corresponding to a proposed value of a magnetic field produced by the device-under-test at the position of interest. A magnetic field at the position of interest on the device under test is sensed. The magnetic field includes a component corresponding to the feedback magnetic field and a component corresponding to the magnetic field produced by the device-under-test. A series of pulses having a frequency corresponding to a frequency of a clock signal of the device-under-test is generated. The pulses of the series of pulses may be offset from the clock signal by a known delay. In response to the pulses, the sensed magnetic field is sampled at sampling times corresponding to the pulses to produce a sampling signal having values that indicate whether the sensed magnetic field exceeds a threshold value at each sampling times. The sampling signal is filtered digitally to produce a first indicator when the sensed magnetic field exceeds the threshold value at more than a predetermined number of sampling times and a second indicator when the sensed magnetic field does not exceed the threshold value at more than the predetermined number of sampling times. A counter value is incremented in response to the first indicator and decremented in response to the second indicator. The counter value corresponds to the proposed value of the magnetic field produced by the device-under-test at the position of interest.

In another general aspect, the invention features producing an integrated circuit device in a way that eases measuring magnetic fields produced by the integrated circuit device. The integrated circuit device includes circuit blocks, each of which includes a power line providing a connection to a source of power and a ground line providing a connection to electrical ground. A power inductive loop is formed in the power line of one or more circuit blocks. The power inductive loop generates a magnetic field corresponding to current flow through the power line.

Similar inductive loops may be formed in ground lines and clock lines of a circuit block. When a circuit block includes latches, latch inductive loops may be formed in the latch. The inductive loops permit measurement of current flows within the circuit block.

In another approach, a test circuit may be formed to test a state of an internal node of a circuit block. The test circuit includes a first transistor having a gate connected to the internal node of the circuit block and a second transistor having a gate connected to a test activation line. The transistors may be connected in series between electrical ground and electrical power.

When the internal node is a complementary node having positive and inverted values, the test circuit may be formed by connecting the gate of the first transistor to the positive value of the internal node, connecting a gate of a third transistor to the inverted value of the internal node, connecting the first and third transistors in series between electrical ground and electrical power, and forming loops in paths between the first and third transistors and electrical ground and power. The loops surround a common area and one of the loops is formed in a clockwise direction while the other loop is formed in a counter-clockwise direction. The second transistor may be connected between electrical ground and the first and third transistors.

Other features and advantages will become apparent from the following detailed description, including the drawings, and from the claims.

DETAILED DESCRIPTION

Figure 1A:
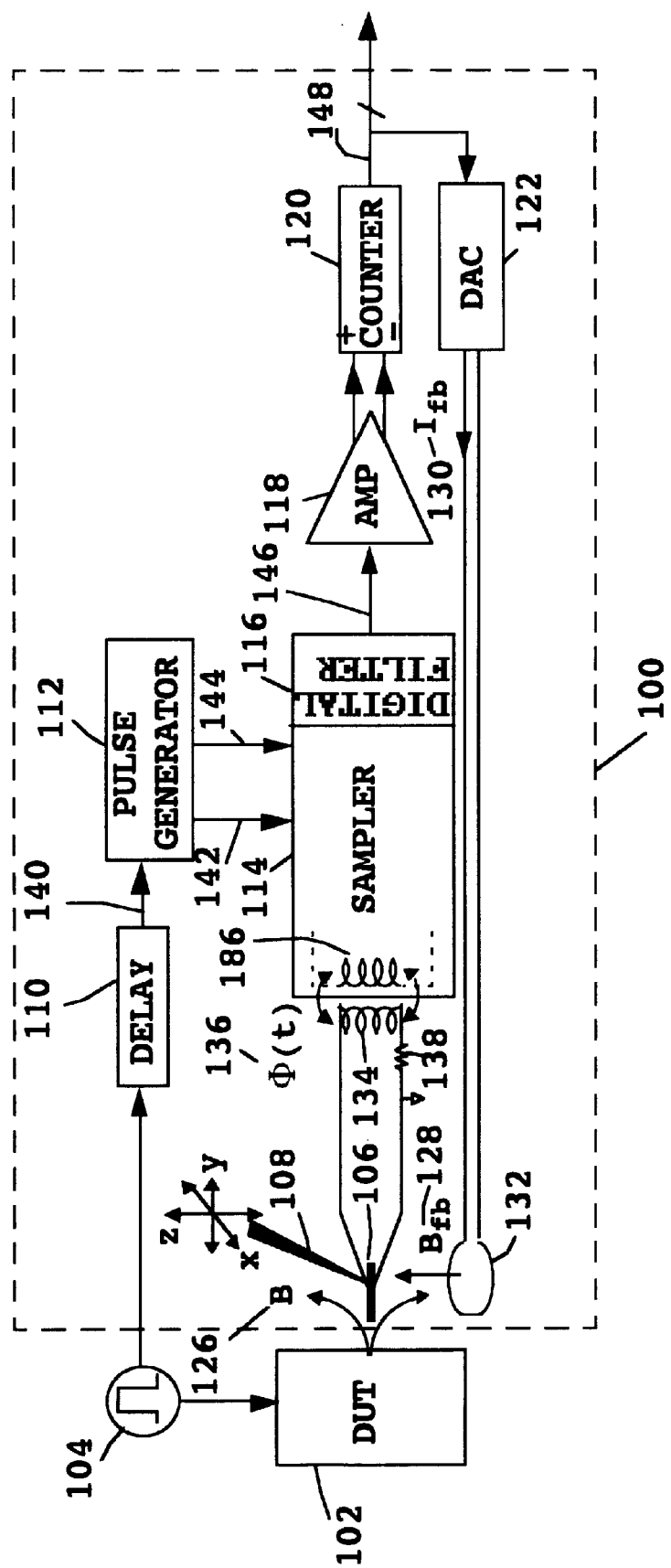
FIG. 1A is a system schematic for a high-speed FSM.

FIG. 1A illustrates a high-speed flux sampling microscope (FSM) system 100, including a device-under-test (DUT) 102 and a system clock 104. The high-speed FSM includes a magnetoresistive sensor 106, a scanning probe 108, a precision delay generator 110, a pulse generator 112, a superconductive digital sampling circuit 114, a superconductive digital filter 116, an amplifier 118, a counter 120, and a digital-to-analog converter (DAC) 122.

The magnetoresistive sensor 106 detects a directional (x or y or z) component of the net magnetic field $B_{net}$ 124 at a particular spatial (x,y,z) location of the DUT 102. The net magnetic field $B_{net}$ 124 is the difference between the time-varying magnetic field B 126 at (x,y,z) due to currents within the DUT 102, and a feedback magnetic field $B_{fb}$ 128 due to a feedback current $I_{fb}$ 130 in a feedback loop 132 close to the sensor 106. The output current from the sensor 106 produces in a coil 134 a time-varying magnetic flux $\Phi(t)$ 136 that is proportional to $B_{net}$ 124. An impedance termination 138 between the coil and the sensor is used to avoid signal reflections at high speeds. Other details of the sensor 106 are described below. The sensor 106 is mounted on a scanning probe 108 and scanned over the surface of the DUT 102.

The precision delay generator 110 delays the system clock 104 by a specified delay $\delta$. The output of the delay generator 110 is the delayed clock 140. Delay generator 110 can be a micromechanical delay line or an accurate transistor-based delay line.

The pulse generator 112 generates a pulse train 142 with 2N+1 pulses such that the rising edges of the pulses are precisely aligned to the delayed clock 140. The number N can vary from zero to several hundreds, depending on the time resolution specified for the measurement. The functions of the pulse generator 112 and the delay generator may be combined in a single instrument. The pulse generator 110 also supplies a reset signal 144 for the sampler after the filter circuit 116 has responded.

The superconductive digital sampling circuit 114 samples the magnetic flux $\Phi(t)$ 136 at the rising edge of each pulse of the pulse train 142 and produces a magnetic flux quantum at the output only if the magnetic flux $\Phi(t)$ 136 is greater than zero.

The superconductive digital filter circuit 116 counts the number of flux quantum pulses produced by the sampler. The filter 116 produces a 0.1–1 millivolt digital high ("1") signal F 146 only if the number of flux quanta is greater than N. The sampler 114 and the filter 116 may be implemented on the same integrated circuit chip.

The semiconductor amplifier 118 amplifies the digital signal F 146. If the digital signal F 146 is high (0.1–1 millivolt), the amplifier 118 latches the amplified signal and produces a 1–2 volt digital increment signal for the counter 120. Otherwise, if the digital signal F 146 is low, the amplifier produces a 1–2 volt decrement signal for the digital counter 120.

The CMOS digital counter 120 counts the net number of increment/decrement pulses produced by the amplifier 118. When the counter 120 settles to a stable value, the output 148 of the counter 120 gives the value of the directional component of the magnetic field B(t) 126 at the spatial location (x,y,z) at time instant t=$\delta$ relative to the clock edge.

The digital-to-analog converter (DAC) 122 produces a feedback current $I_{fb}$ 130 in the feedback loop 132 proportional to the output 148. When the closed loop stabilizes, the magnetic field $B_{fb}$ 128 due to the feedback current $I_{fb}$ 130 in the feedback loop 132 nulls the particular directional (x, y, or z) component of magnetic field B(t) 126 such that the directional component of the net magnetic field $B_{net}$ 124 equals zero.

Figure 1B:
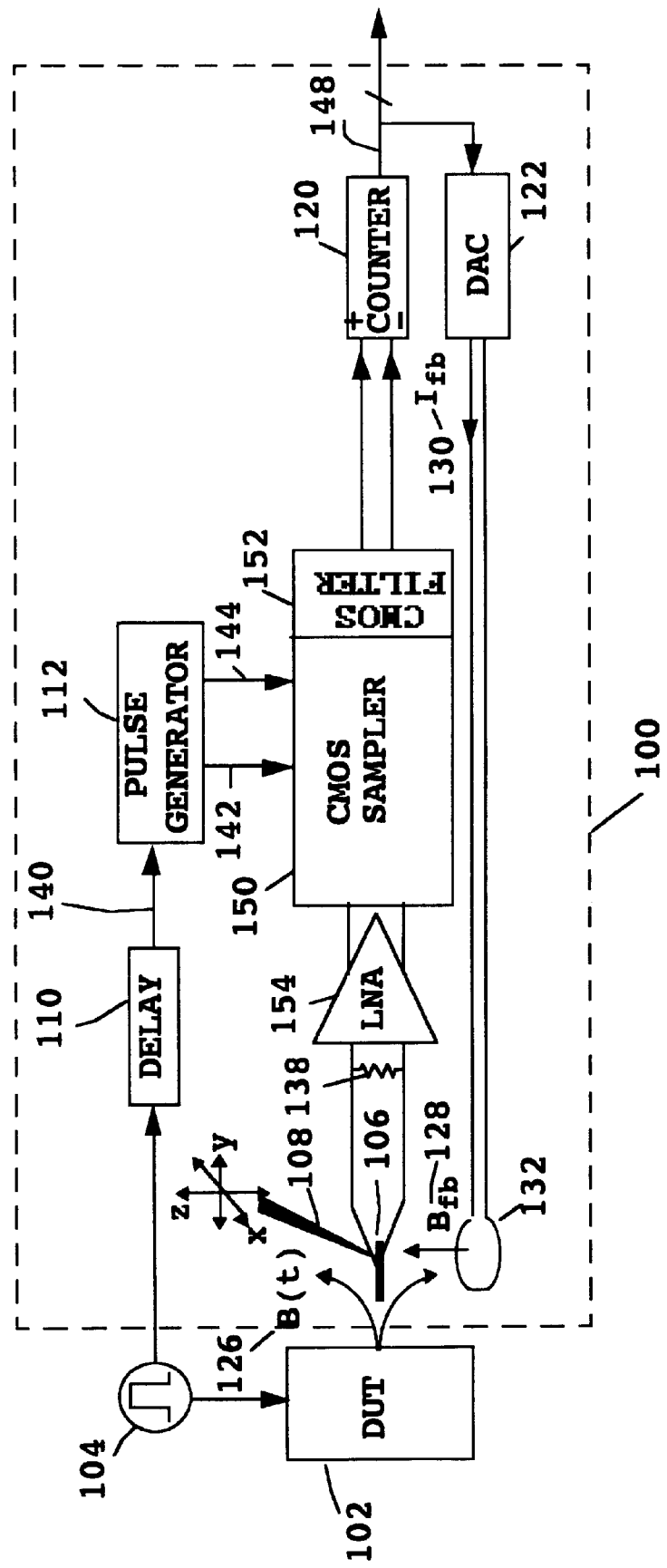
FIG. 1B is a system schematic for a low-cost, lower performance FSM.

If a low-cost FSM module is desired, superconductive sampler 114 and the filter 116, which operate cryogenically, can be replaced by semiconductor sampler 150 and filter circuits 152, as shown in FIG. 1B. In addition, the coil 134 may be eliminated and the voltage across the resistor 138 may be read-out by a sensitive low-noise amplifier LNA 154. The amplifier 118 following the superconductive filter 116 is not required.

Figure 2A:
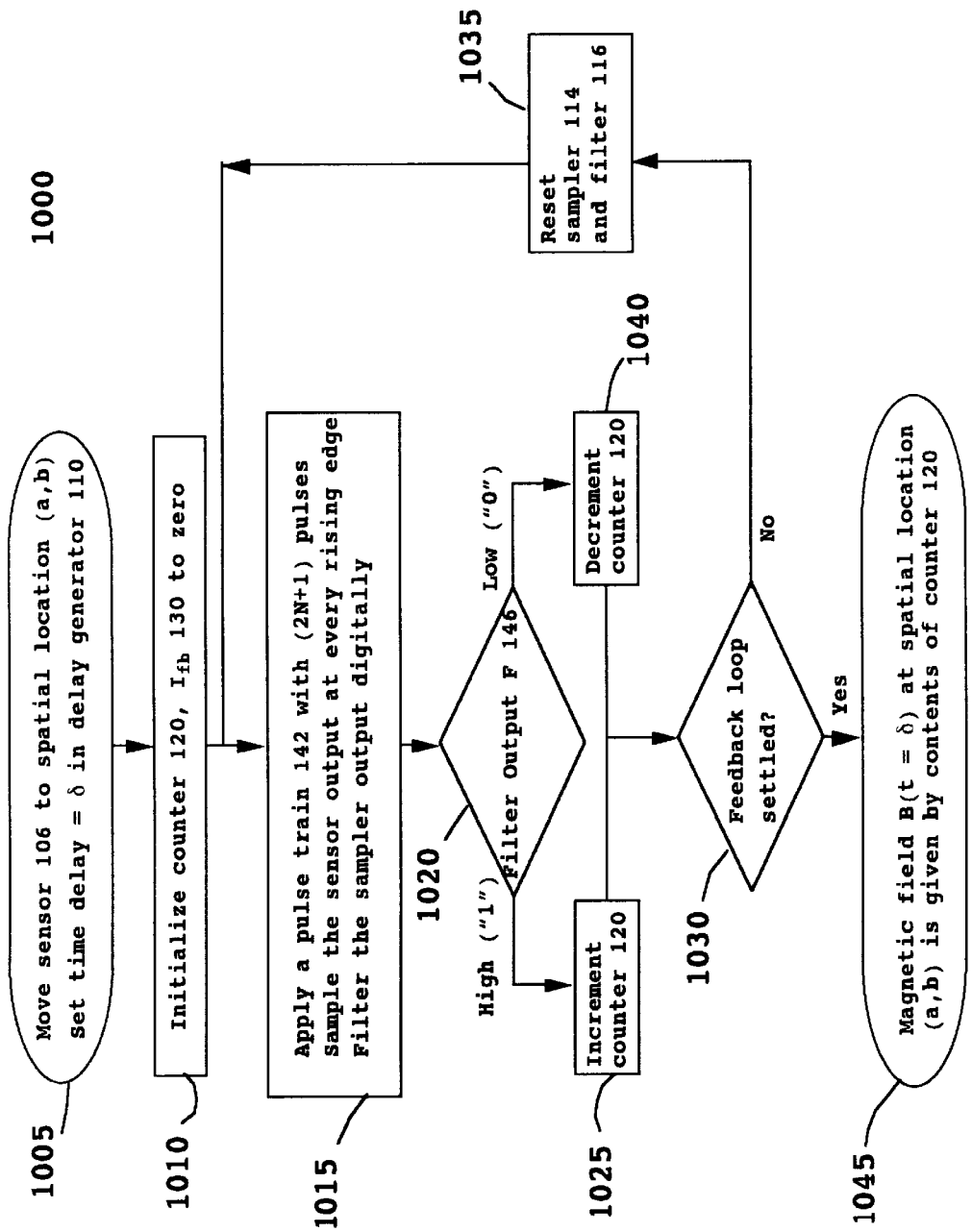
FIG. 2A is a flow chart of the FSM measurement technique.

The high-speed FSM shown in FIG. 1A is operated according to the procedure 1000 illustrated in FIG. 2A. First, the sensor 106 is mounted on the probe 108 and positioned at a desired spatial location (say, coordinates (a, b) on the surface of the VLSI chip) for characterization of the local magnetic fields (step 1005). The distance between the DUT 102 and the magnetoresistive sensor 106 can be very small (e.g., 1–10 $\mu$m). The system clock 104 with time-period T is used to synchronize the entire system including the DUT 102.

Figure 2B:
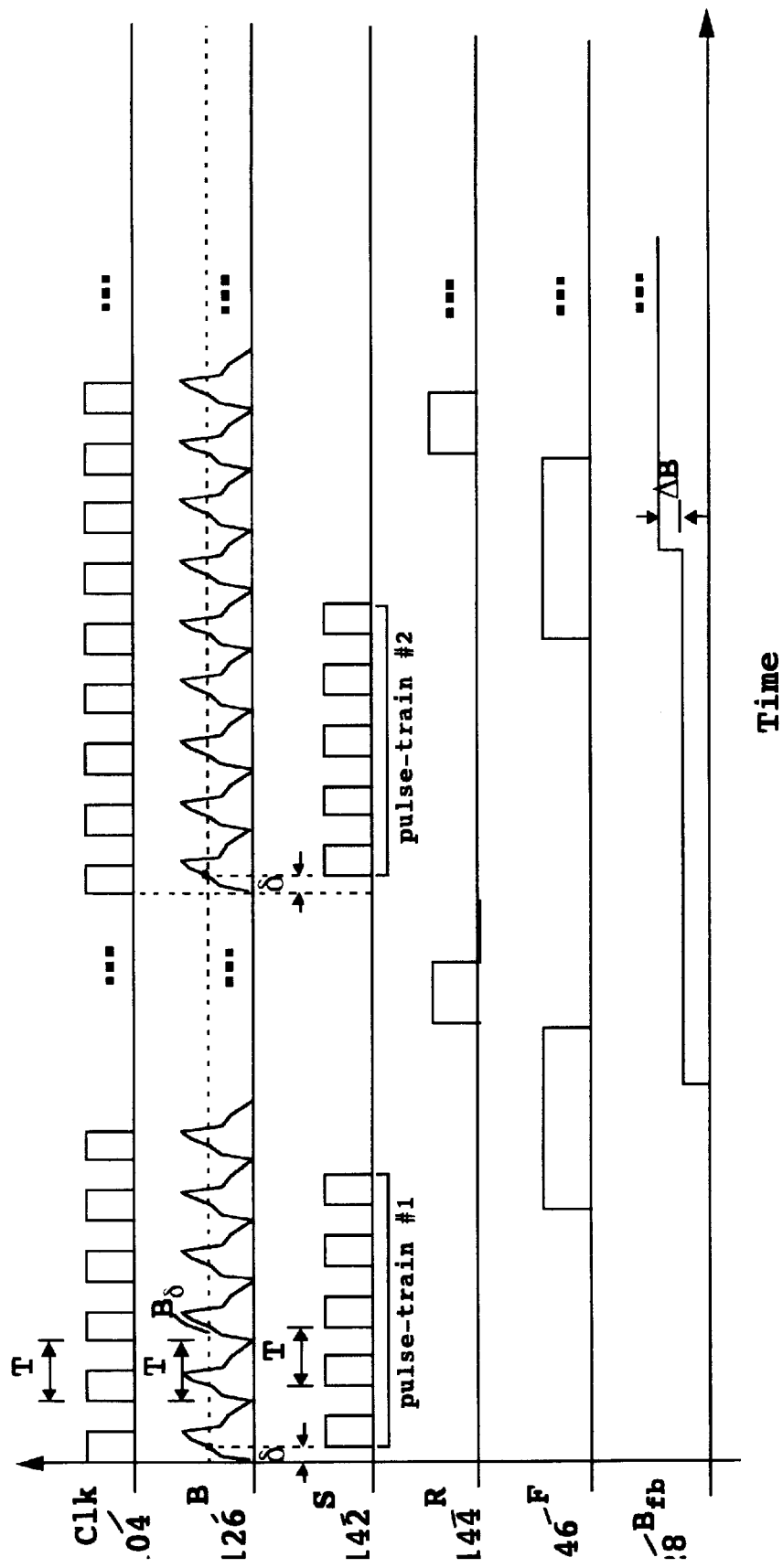
FIG. 2B shows a sampling scheme incorporated within the high-speed FSM graphically for short instants of time.
Figure 2C:
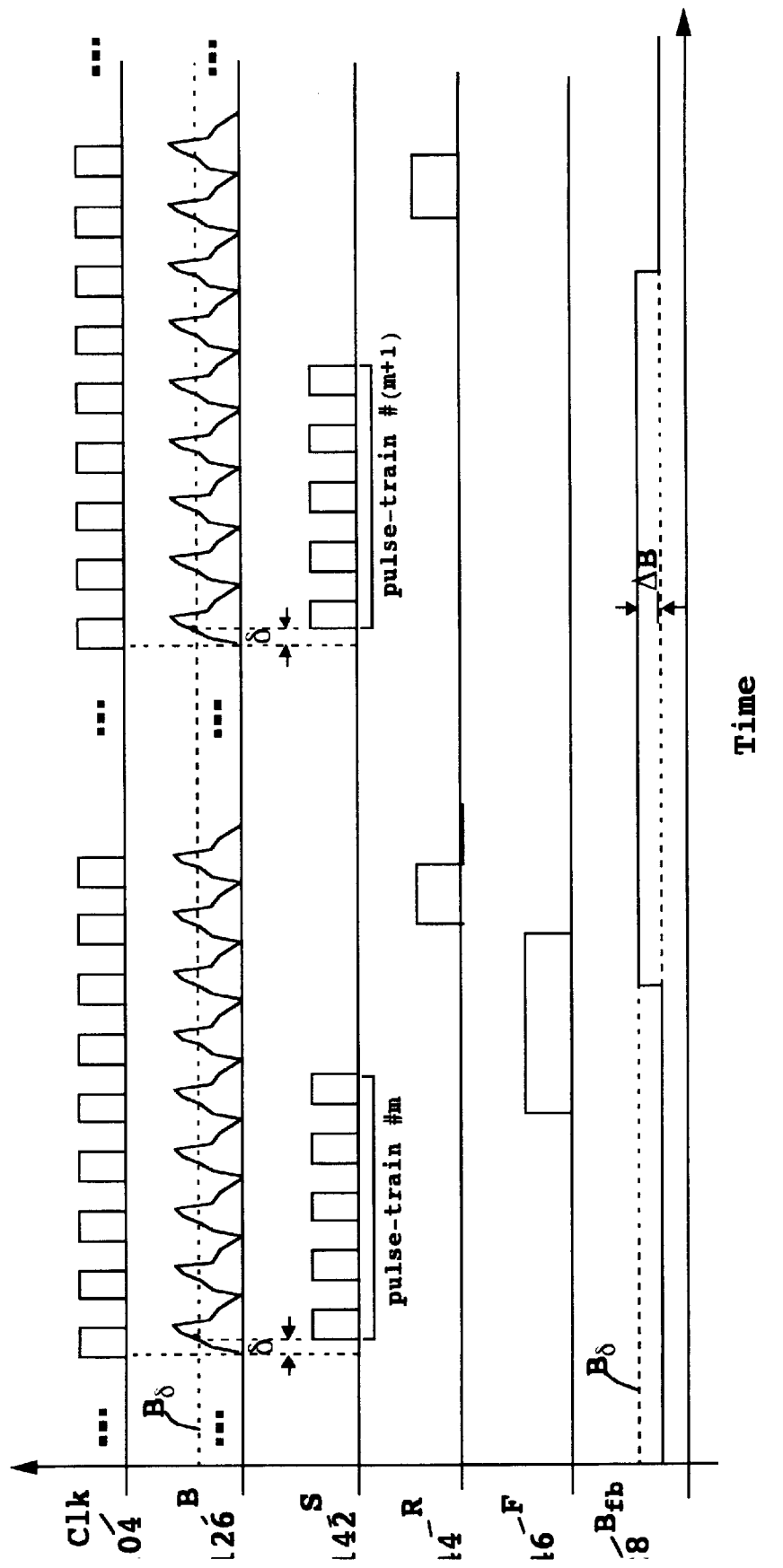
FIG. 2C shows the sampling scheme incorporated within the high-speed FSM graphically after the feedback loop response has settled.

The magnetic field B 126 at each location of the DUT 102 will be periodic with time-period equal to T or an integer multiple of T. The time-profiles of the clock 104, magnetic field B 126, the pulse-train 142, the reset signal 144, the filter output F 146, and the feedback field $B_{fb}$ 128 are illustrated in FIGS. 2B and 2C. At the beginning of the time-sampling process, the feedback field $B_{fb}$ 128, the feedback current $I_{fb}$ 130, and the counter 120 are initialized to zero (step 1010). For purposes of this description, it is assumed that the local magnetic field B at time t=$\delta$ relative to the clock edge ($B_\delta$) is to be measured.

Next, a pulse train is applied (step 1015). If the field $B_\delta$ is positive, the net magnetic field $B_{net}$, which equals the difference between $B_\delta$ and $B_{fb}$, is also positive. The sensor 106 detects $B_{net}$ and produces a positive magnetic flux $\Phi$ 136 in the coil 134. The superconductive sampler 114 samples the magnetic flux $\Phi$ 136 in the coil 134 at every rising edge of the pulse-train 142, and produces 2N+1 flux quanta for the filter 116.

If the number of flux quanta counted by the filter 116 is greater than N, the digital signal F 146 becomes a high ("1") (step 1020). The amplifier 118 amplifies signal F 146 to 1–2 volt levels and produces an increment signal for the counter 120 (step 1025). The counter 120 increments its output 148 and the DAC steps up $I_{fb}$ 130 by one least significant bit (LSB). Hence at the end of the first pulse train, the feedback current $I_{fb}$ 130 is incremented by one LSB. The increment in the feedback field $B_{fb}$ 128 corresponding to one LSB increment in feedback current $I_{fb}$ 130 is denoted by $\Delta B$.

The process continues until the feedback loop stabilizes. If the feedback loop is not stabilized (step 1030), the reset signal 144 is applied to the filter 116 to re-initialize the flux quantum counting process (step 1035). If the net magnetic field $B_{net}$ 124 remains positive, the process is repeated during the next pulse train, and the feedback field $B_{fb}$ 128 is again incremented by $\Delta B$.

The embedded feedback loop is stabilized after say, the mth pulse train (see FIG. 2C), when the net magnetic field $B_{net}$ 124 equals zero (i.e., $B_{fb}=B_\delta$) or slightly negative by an amount less than $\Delta B$. The sensor 106 then produces a zero or negative magnetic flux $\Phi$ 136 in the coil 134. Hence during the (m+1)th pulse train, the superconductive sampler does not produce any flux quanta for the filter 116. The number of flux quanta counted by the filter is thus less than or equal to N, and the digital signal F 146 is low ("0"). The counter 120 decrements its output 148 (step 1040), and the feedback field $B_{fb}$ 128 is decremented to $B_\delta-\Delta B$. The net magnetic field $B_{net}$ becomes positive, and the feedback field $B_{fb}$ 128 will be incremented by $\Delta B$ at the end of the next ((m+2)th) pulse train. The feedback field thus oscillates between $B_\delta-\Delta B$ and $B_\delta$. The feedback field is proportional to the output 148 of the counter 120. After the feedback loop is stabilized, the output 148 reflects the value of the local magnetic field $B_\delta$ at time t=$\delta$ relative to the clock edge (step 1045). The resolution is determined by $\Delta B$, which, in turn, is determined by the resolution of the DAC 122 and the thermal noise contribution of the sensor 106 and the sampler 114. The DAC limitations imply resolution much less than nanotesla, which is far beyond the sensing requirements. The thermal noise contribution is scaled down by the filter 116 to nanotesla regimes, as discussed below.

The delay between the sampling instant and the clock (i.e., the time duration $\delta$) is varied to trace all time points, and then the magnetoresistive transducer is moved to another spatial location. If the magnetic field $B_\delta$ was negative, the sampling process would be similar to the above process but the counter and the feedback field would be decremented to reach the stable loop condition.

In the case of the low-cost sampler shown in FIG. 1B, the sampling scheme remains the same, but the components are implemented in complementary metal-oxide semiconductor (CMOS) circuits or other advanced circuit technologies operating at room temperature (300 K). Since the semiconductor samplers cannot sense currents or magnetic field fluxes directly, the small voltages (e.g., 15 $\mu$V for 100 nT magnetic fields) across the sensor 106 and the resistor 138 are detected by pre-amplifying the voltage signal to 0.2–0.5 V signals using a low-noise amplifier LNA 154. The voltages are sampled by CMOS sampler 114 at every rising edge of the pulse-train 142, and CMOS digital filter 152 counts the number of "1"s detected by the sampler. If the number of "1"s is greater than N, the counter 120 is incremented. Otherwise, the counter 120 is decremented. The operation of the low-cost FSM is same as that of the high-speed FSM. Maximum sampling bandwidth (reciprocal of time period T in FIG. 2B) is limited by the bandwidth and the maximum noise voltage of the LNA 154. For amplification gains of $10^4$, the bandwidths are limited to 1–20 MHz. The performance of the low-cost sampler is strongly dependent on the performance of LNA 154.

Figure 3A:
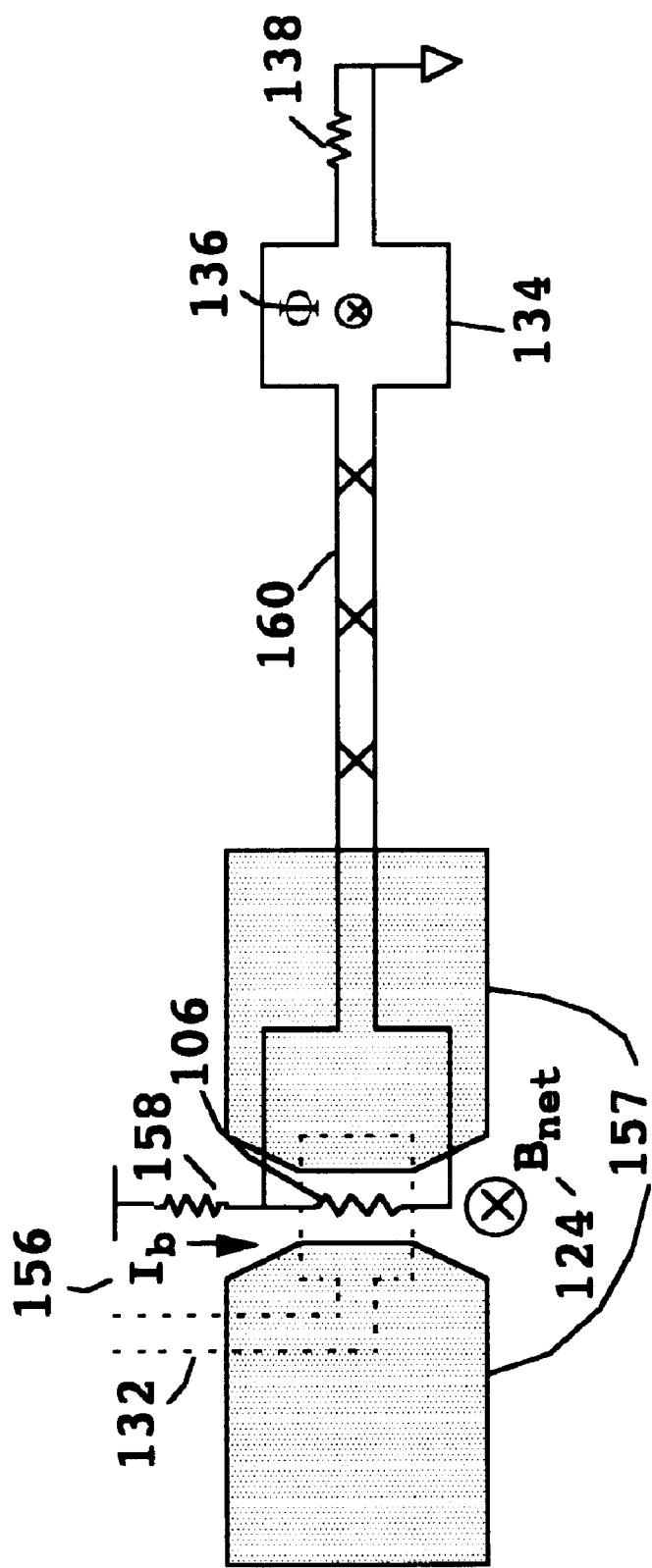
FIG. 3A shows the construction of a magnetoresistive (MR) transducer with single-ended output.

There are several configurations possible for the magnetoresistive (MR) sensor 106 in the FSM. The simplest configuration, which uses a single MR sensor 106, is illustrated in FIG. 3A. The MR sensor 106 is placed between magnetic (NiFe) thin film flux-concentrators 157 which focus the net magnetic field $B_{net}$ 124 onto the MR sensor 106. The feedback coil 132 is formed by a normal metal loop over the MR sensor 106. The entire assembly is monolithically integrated on a chip. The MR sensor 106 is biased by a current $I_b$ 156 supplied through a bias resistor 158. The output current from the sensor 106 is conveyed to the coil 134 coupled to the superconductive sampler 114 via a shielded twisted-wire 160. The ends of the twisted wire are terminated by a resistor 138 that matches the characteristic impedance of the twisted wire 160. The output current produces the magnetic flux $\Phi$ 136 in the coil 134. The flux $\Phi$ 136 is given by the relation:

$$\Phi = L(\Delta R/R)(I_b/2)$$

where ΔR is the change in the nominal resistance R of the MR sensor 106 due to the net magnetic field $B_{net}$ 124, and L is the inductance of the coil 134. The nominal resistance R of the MR sensor 106 is equal to the value of the termination resistor 138. In the case of the low-cost FSM implementation, the voltage across the termination 138 is amplified instead of sampling the magnetic flux Φ 136.

Figure 3B:
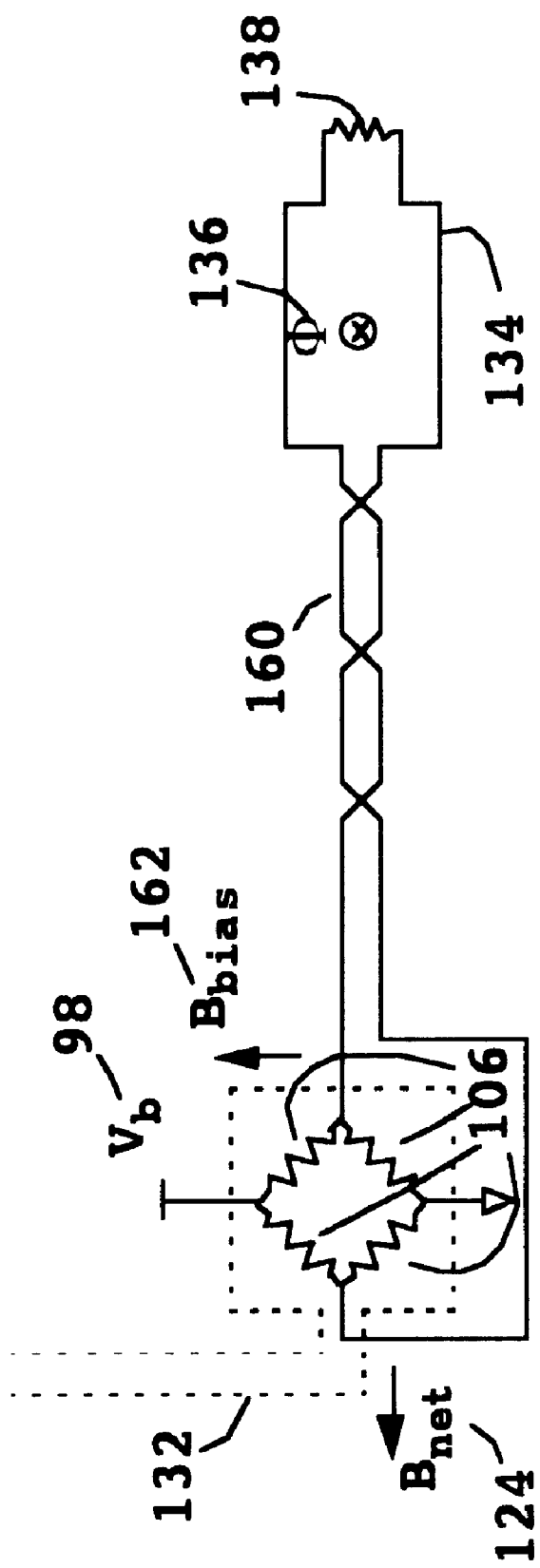
FIG. 3B shows the construction of a magnetoresistive (MR) transducer based on a Wheatstone bridge configuration.

The second configuration illustrated in FIG. 3B includes four MR sensors 106 forming a Wheatstone bridge. In this configuration, which is widely used in the magnetoresistive sensor industry, the output current is coupled to the coil 134 in a differential sense. An example of such a sensor is the HMC 1001 from Honeywell, Inc. The bias field $B_{bias}$ 162 is permanently applied to the MR elements, and the resistance R of all four MR sensors 106 is nominally the same. This is because the orientation of the all MR elements is the same with respect to the direction of the bias field $B_{bias}$ 162. The bridge supply $V_b$ causes current to flow through the MR sensors 106, but the output current in the shielded wires and the termination 138 is zero in the absence of external magnetic fields. When the net magnetic field $B_{net}$ is applied, the direction of the effective magnetic field applied to the MR sensors 106 change, which causes the resistance of two diagonally opposed MR elements to increase from R to R+ΔR and the resistance of the remaining MR elements to decrease from R to R−ΔR. This forces a current through the coil 134 and the termination 138. The magnetic flux Φ 136 coupled to the coil is $\Phi = L(\Delta R/R)(V_b/R_0)$ where $R_0$ represents the resistance of the termination 138. In the case of the low-cost FSM implementation, the voltage across the termination 138 is amplified instead of sampling the magnetic flux Φ 136.

All three directional components of the net magnetic field $B_{net}$ 124 may be measured by including three Wheatstone bridges on a single MR sensor 106. The bias field created by magnetic material straps and the magnetization of the MR elements are changed to detect the directional components without the need for physically orienting the sensor 106 in different directions. Examples of such sensors include the HMC 2002 and HMC 2003 from Honeywell Inc.

Figure 4A:
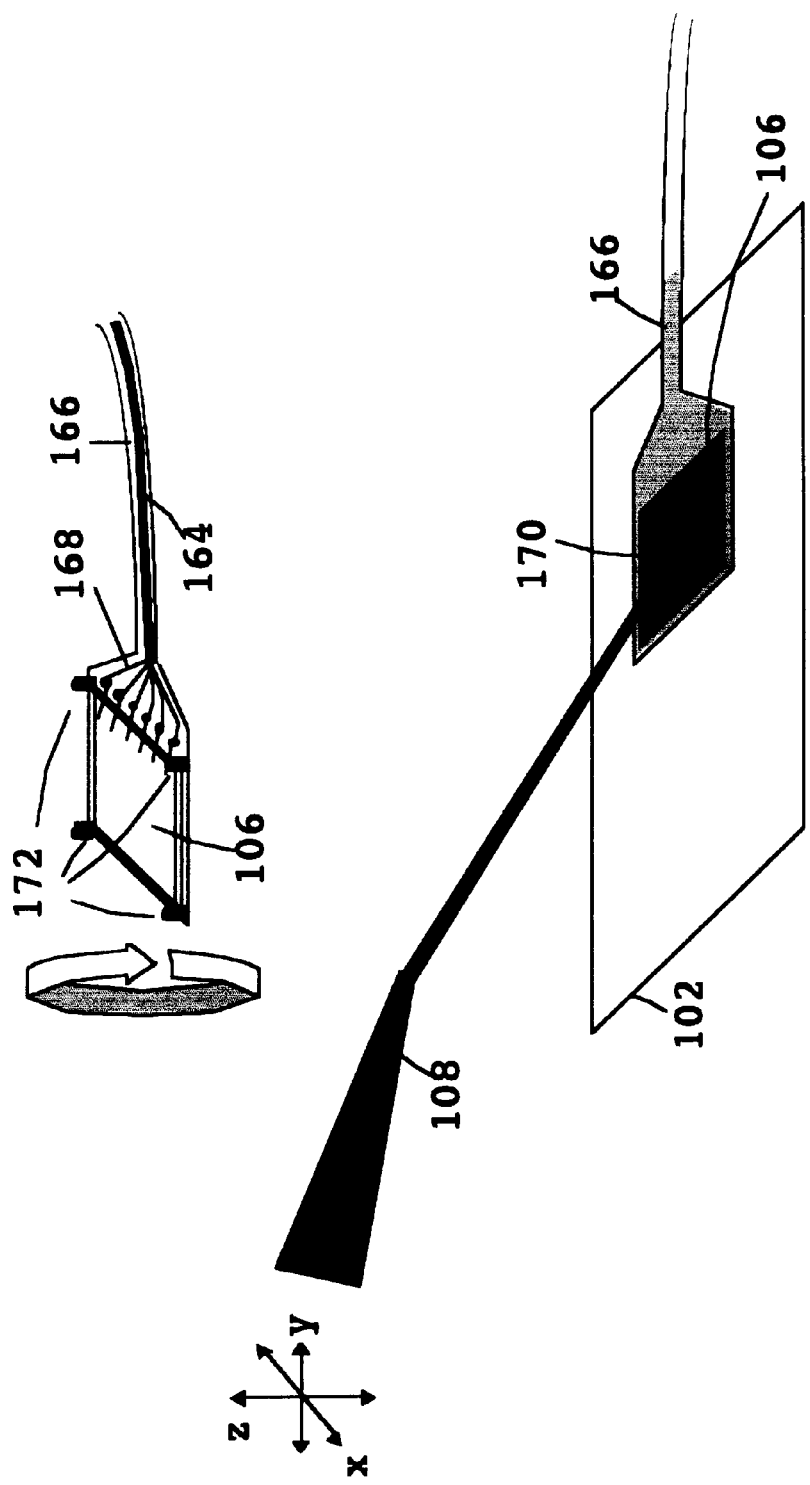
FIG. 4A shows the physical design of a scanning probe incorporating the MR transducer on a flexible substrate.
Figure 4B:
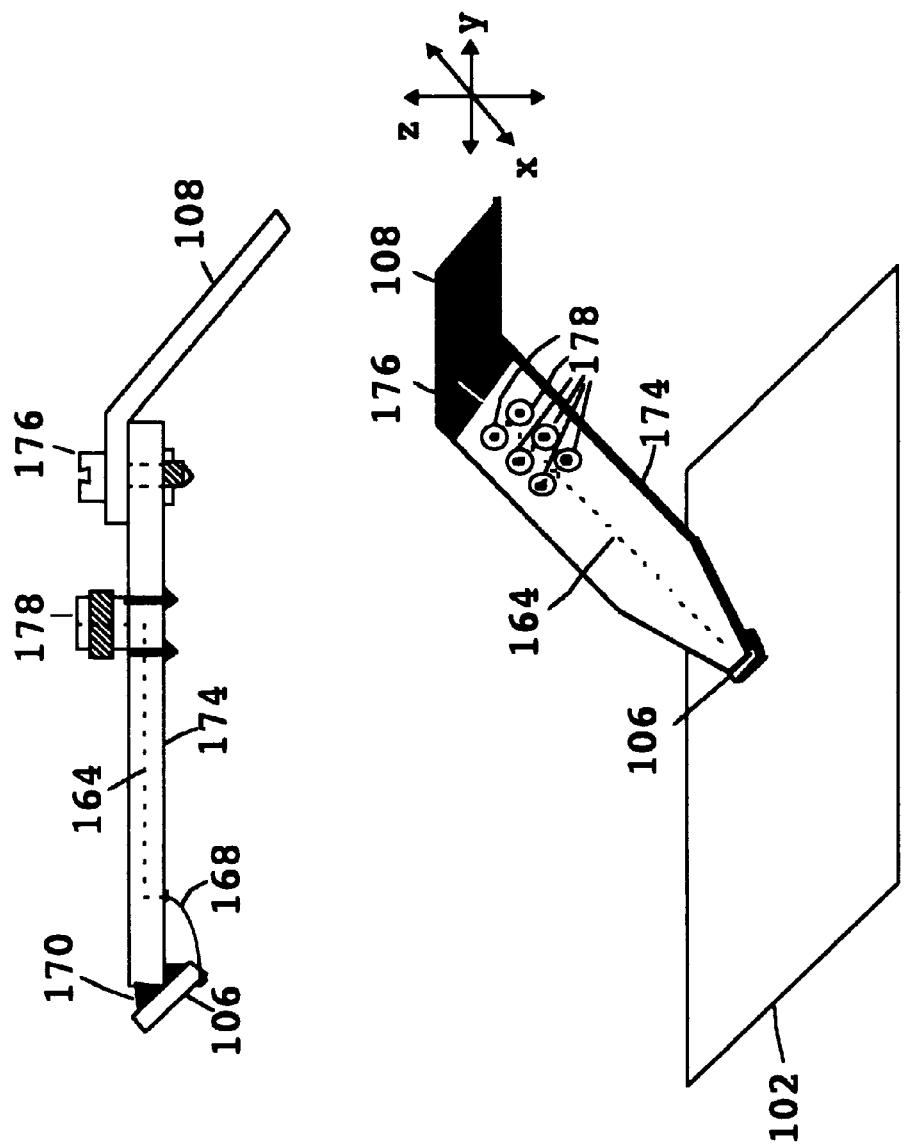
FIG. 4B shows the physical design of a scanning probe incorporating the MR transducer on a rigid substrate.

The MR sensor 106 forms the tip of the scanning probe 108 which is scanned over the surface of the DUT 102. FIG. 4A shows a practical embodiment of such an arrangement. The input/output (I/O) leads of the sensor 106 are connected to copper wiring 164 on a flexible substrate 166 by fine-pitch ribbon or wire bonds 168. The arrangement is flipped upside down and the back of the flexible substrate is rigidly attached to the tip of a scanning X-Y-Z probe 108 by non-magnetic glue or epoxy 170. The stand-off posts 172 prevent direct contact of the sensor 106 to the DUT 102. Alternatively, FIG. 4B shows a more rigid probe arrangement with the sensor 106 bonded onto a standard printed circuit board 174. The board 174 is mechanically attached to the scanning probe 108 by screws 176, and the sensor 106 is attached to the board by non-magnetic glue or epoxy 170 and wire-bonds 168 such that the sensor plane is parallel to the scanning probe 108. Each I/O of the sensor is routed through the copper wiring 164 in the printed circuit board 174 to connectors 178 for coaxial cables. The flexible substrate is useful for high-resolution scans whereas the printed circuit approach is useful for low-cost production-oriented environments.

Different types of superconductive sampler circuits may be employed. Examples include those described by McDonald et al. in "Picosecond Applications of Josephson Junctions," IEEE Transactions on Electron Devices, Vol. 27, pp. 1945–1965, 1980; Faris in "Generation and Measurement of Ultrashort Current Pulses with Josephson Devices," Applied Physics Letters, Vol. 36, pp. 1005–1007, 1980; Wolf et al. in "A Josephson Sampler with 2.1 ps Resolution," IEEE Transactions on Magnetics, vol. 21, pp. 226–229, 1985; and Whiteley et al. in "A Josephson Junction Time Domain Reflectometer with Room Temperature Access," IEEE Transactions on Magnetics, Vol. 23, pp. 899–902, 1987, all of which are incorporated herein by reference.

Figure 5:
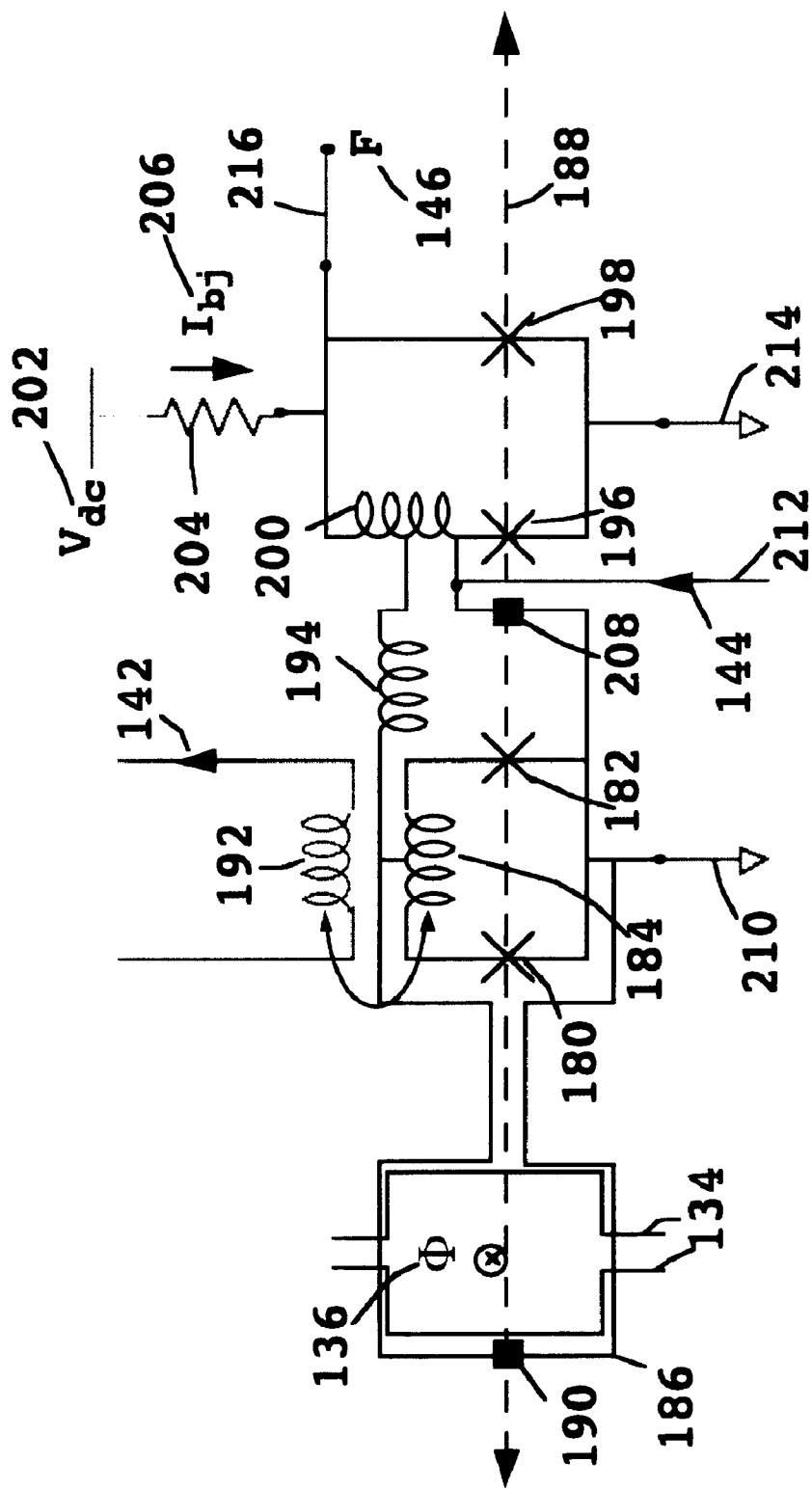
FIG. 5 shows the circuit diagram of a direct-coupled, QFP/SQUID-based Josephson junction sampler in a single YBaCuO layer integrated circuit technology.

FIG. 5 illustrates the implementation of a simple Josephson sampler in a bicrystal-based high-Tc superconductor Josephson junction technology. The sampler includes two basic Josephson circuits: a quantum flux parametron (QFP), such as is described by Hosoya et al. in "Quantum Flux Parametron: A Single Quantum Flux Device for Josephson Supercomputer," IEEE Transactions on Applied Superconductivity, Vol. 1, pp. 77–89, June 1991; and Harada et al. in "Flux Transfer Devices," Proceedings of the IEEE, Vol. 77, pp. 1280–1286, August 1989, and a superconducting quantum interference device (SQUID), such as is described by Clarke in "Principles and Applications of SQUIDs," Proceedings of the IEEE, Vol. 77, pp. 1208–1223, August 1989).

The QFP includes two Josephson junctions $J_1$ 180 and $J_2$ 182 forming a superconductive loop with loop inductance $L_{qfp}$ 184. The magnetic flux Φ 136 is coupled to the QFP via the superconductive loop 186. The superconductive loop 186 is tightly coupled to the normal metal coil 134. The bicrystal axis is symbolically represented by the line 188. The Josephson junction 190 is a wide area junction with very high critical current, and always remains in the superconductive state. The QFP operates as a flux comparator and a latch that samples the magnetic flux Φ 136 through the superconductive loop 186 at each rising edge of the excitation pulse train 142 through the inductance $L_{ex}$ 192. The output current of the QFP is directly coupled to the SQUID via the output inductance $L_O$ 194. The SQUID is formed by Josephson junctions $J_3$ 196 and $J_4$ 198 and the loop inductance $L_{sq}$ 200. An arrangement of a low-voltage (e.g., 3–5 mV) DC source $V_{dc}$ 202 and a resistor 204 supplies a bias current $I_{bj}$ 206 to the SQUID. The SQUID acts like a sensitive current-to-voltage transducer with output voltage F 146 of the order of 100–200 μV. If the magnetic flux Φ 136 is positive at any rising edge of the pulse train 142, the QFP produces a flux quantum into the output loop formed by $L_O$ 194 and part of the $L_{sq}$ 200. The positive output current in the inductors $L_O$ 194 and coupled section of $L_{sq}$ 200 lowers the critical current of the SQUID below the bias current $I_{bj}$ 206. This results in a small (e.g., 150 μV) but finite output voltage F 146.

If the magnetic flux Φ 136 is negative or zero, the current through inductors $L_O$ 194 and coupled section of $L_{sq}$ 200 is negative, and the SQUID remains in the superconducting state with zero output voltage F 146. Assuming Josephson junctions with equal critical currents ($I_0$=100 μA), the typical design parameters for YBaCuO technology are $L_{qfp}$=$L_O$=2 pH, $L_{sq}$=4 pH, $I_{bj}$=200 μA, and 20% of the QFP output flux should coupled to the SQUID. The intrinsic bandwidth of the QFP current samplers is at least 100 GHz and is not a limiting feature of the FSMs. The reset signal 144 forces the wide Josephson junction 208 into a voltage-state and annihilates flux-quanta in $L_O$ 194 before the arrival of the next pulse train 142. It is possible to implement the entire sampler 114 in a single superconductor-layer YBaCuO technology. In such implementations, the I/O leads 210, 212, 214, and 216 and the inductance $L_{ex}$ 192 can be fabricated with normal metals like copper or gold.

The sampler 114 described above may be prone to errors due to thermal noise in the MR sensor 106 and the QFP Josephson junctions J1 180 and J2 182. A simple technique for increasing the resolution at high sampling bandwidths is to incorporate an averaging filter 116 along with the sampler 114. The inductor $L_0$ 194 can be made large to integrate/count the flux-quanta released from the QFP. If a maximum of $(2N+1)\Phi_0$ quanta can be stored in the inductors $L_0$ 194 and coupled section of $L_{sq}$ 200, the threshold flux of the SQUID can be set at $(N+1)\Phi_0$. If $p_e$ is the error probability for a single sampling event, the error probability for oversampling $2N+1$ times at the same spatial location is reduced to $$P_e = \sum_{(N+1)}^{(2N+1)} [^{(2N+1)}c_i] p_e^i.$$

Figure 6:
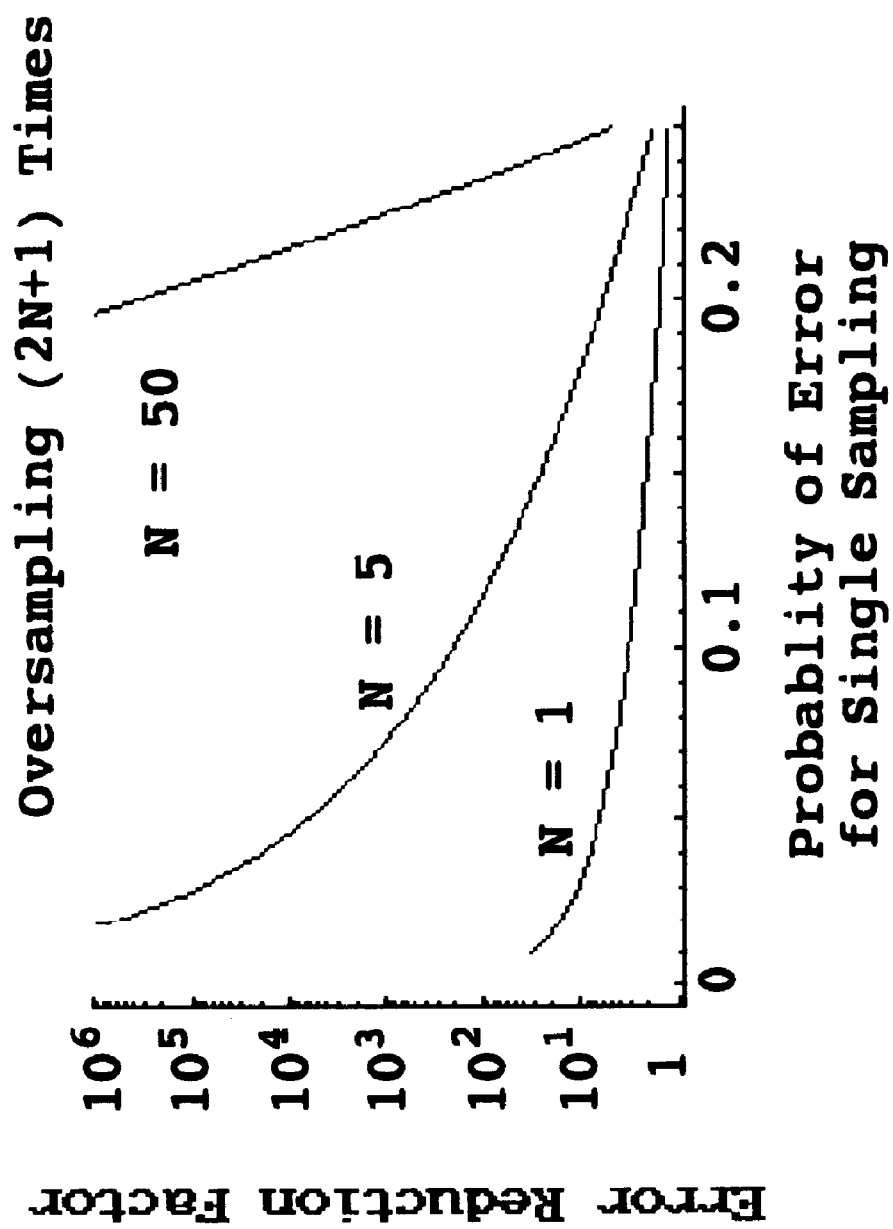
FIG. 6 shows the reduction in sampling error by oversampling and averaging signals at each time point.
Figure 7:
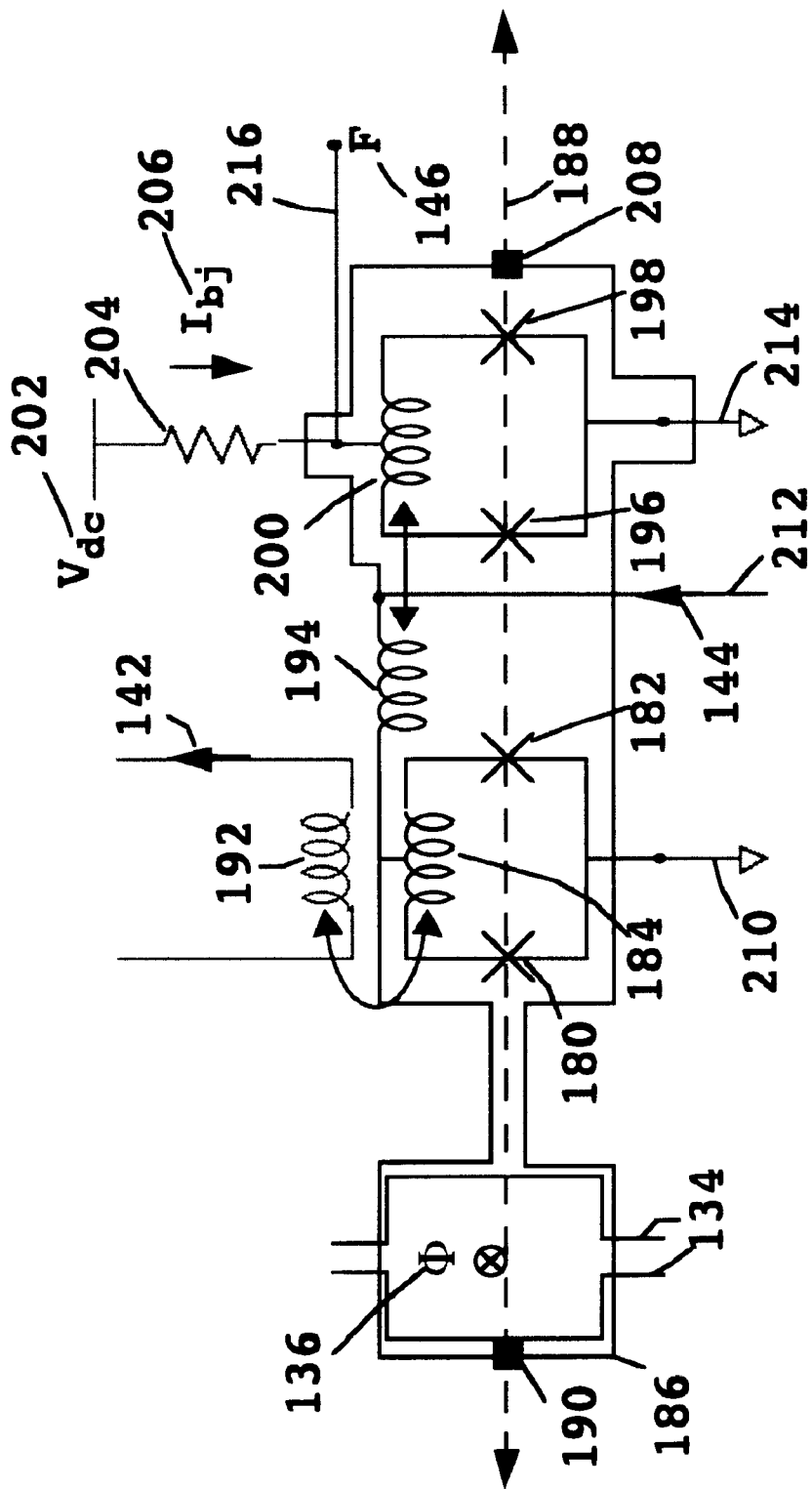
FIG. 7 shows the circuit diagram of a magnetically-coupled, flux-integrating QFP/SQUID-based Josephson junction sampler in YBaCuO technology.

FIG. 6 shows the error probability $P_e$ can be easily reduced by a factor of one million if N>5. Increasing the inductance for oversampling also allows one to magnetically couple the QFP output inductor $L_0$ 194 to the SQUID loop inductance $L_{sq}$ 200 by wrapping $L_0$ 194 around the SQUID loop (FIG. 7). If the sensor 106 output currents are transported to a lower temperature environment (<10 K), the more mature low-Tc Nb or NbN superconductor technology described by Mukhanov in "Superconductive Single-Flux Quantum Technology," 1994 International Solid-State Circuits Conference Digest of Technical Papers, Vol. 37, pp. 126–127, February 1994, may be used for performing very sophisticated digital averaging circuits, such as SFQ counters with random-walk filtering to remove effects of thermal noise.

The time-sampling of magnetic fields and the closed-loop operation of the FSM makes FSM sensitivity and operation relatively independent of the nonlinear properties of the magnetoresistive transducers and the QFP in the sampler. Also since the sensor 106 and the sampler 114 are coupled by short flexible (vibration-absorbing) wires or cables, we can use miniature closed-cycle refrigerators to cool the sampler to 77 K or below.

The amplifier 118, counter 120, and the DAC 122 can be implemented using commercially available components in a variety of ways. These components of the high-speed FSM operate at low-speeds because of the oversampling process. For example, if the pulse train 142 has 10001 pulses (i.e., N=5000) and the sampling bandwidth is 1 GHz, the bandwidth of the amplifier 118, counter 120, and the DAC 122 is 100 kHz. There are several commercially available low-noise amplifiers. such as the LT1028 from Linear Technology Inc. and the Ha-103-35 from HYPRES Inc., which can amplify 100–200 $\mu$V digital signal F 146 to 1–2 V at 100 kHz.

Figure 8:
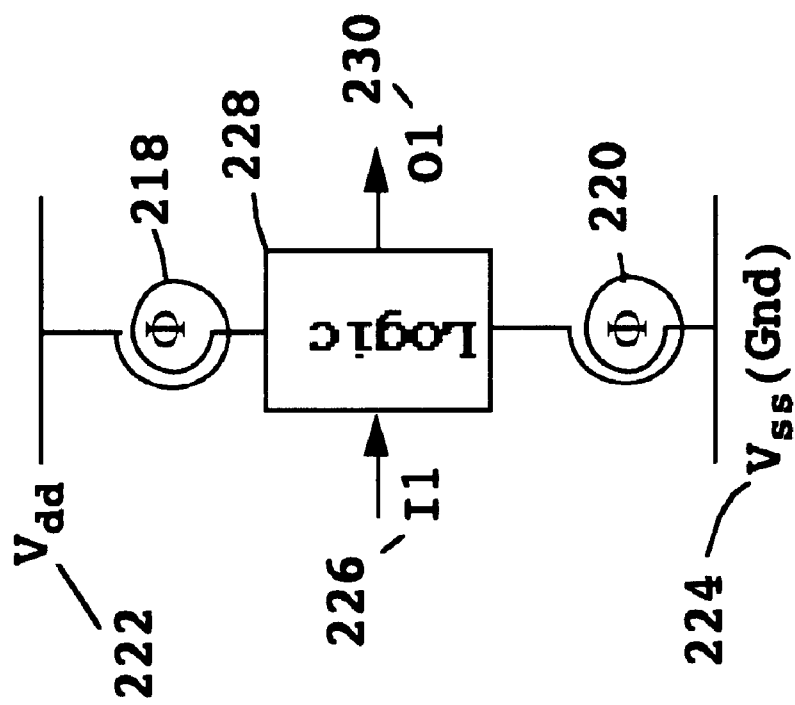
FIG. 8 shows inductive loops designed in supply and ground interconnections of logic circuits to enable FSMs to detect $I_{DDQ}$ or $I_{DDT}$ currents in small logic blocks.

As discussed above, FSM can directly observe currents in the supply and ground lines of small logic blocks, and thereby overcome limitations posed by increased subthreshold currents in scaled CMOS technologies. This direct observance of currents can significantly improve the diagnosis of faults in complex logic elements and in determining the defect mechanisms. FIG. 8 shows an embodiment where tiny (for example, ~16 $\mu m^2$) inductive loops ($L_{vdd}$ 218 and $L_{vss}$ 220) are included in the circuit blocks to facilitate the observation of currents in supply $V_{dd}$ 222 and ground $V_{ss}$ 224 interconnections. The inductance of the loops ($L_{vdd}$ 218 and $L_{vss}$ 220) are small (<10 pH) and do not affect the performance of the CMOS circuits. When the data inputs $I_1$ 226 to the logic block 228 cause the output node voltage $O_1$ 230 to rise, the $I_{DDT}$ currents in $L_{vdd}$ 218 can be detected. Otherwise, if the output node voltage $O_1$ 230 discharges, the currents in $L_{vss}$ 220 can be detected. The flux through the loops is larger if multiple turns are used. The FSM can detect currents in lower metal levels and the silicon transistors because the magnetic field is not shielded by the thin normal metal lines used for VLSI interconnections. (The traditional high-speed E-beam methods and electro-optical methods have limited "viewing" capability in VLSI circuits with multilevel interconnections. This is because the electric field from charge-sensitized or voltage-sensitized lines are localized and shielded by multilevel interconnections.)

Figure 9A:
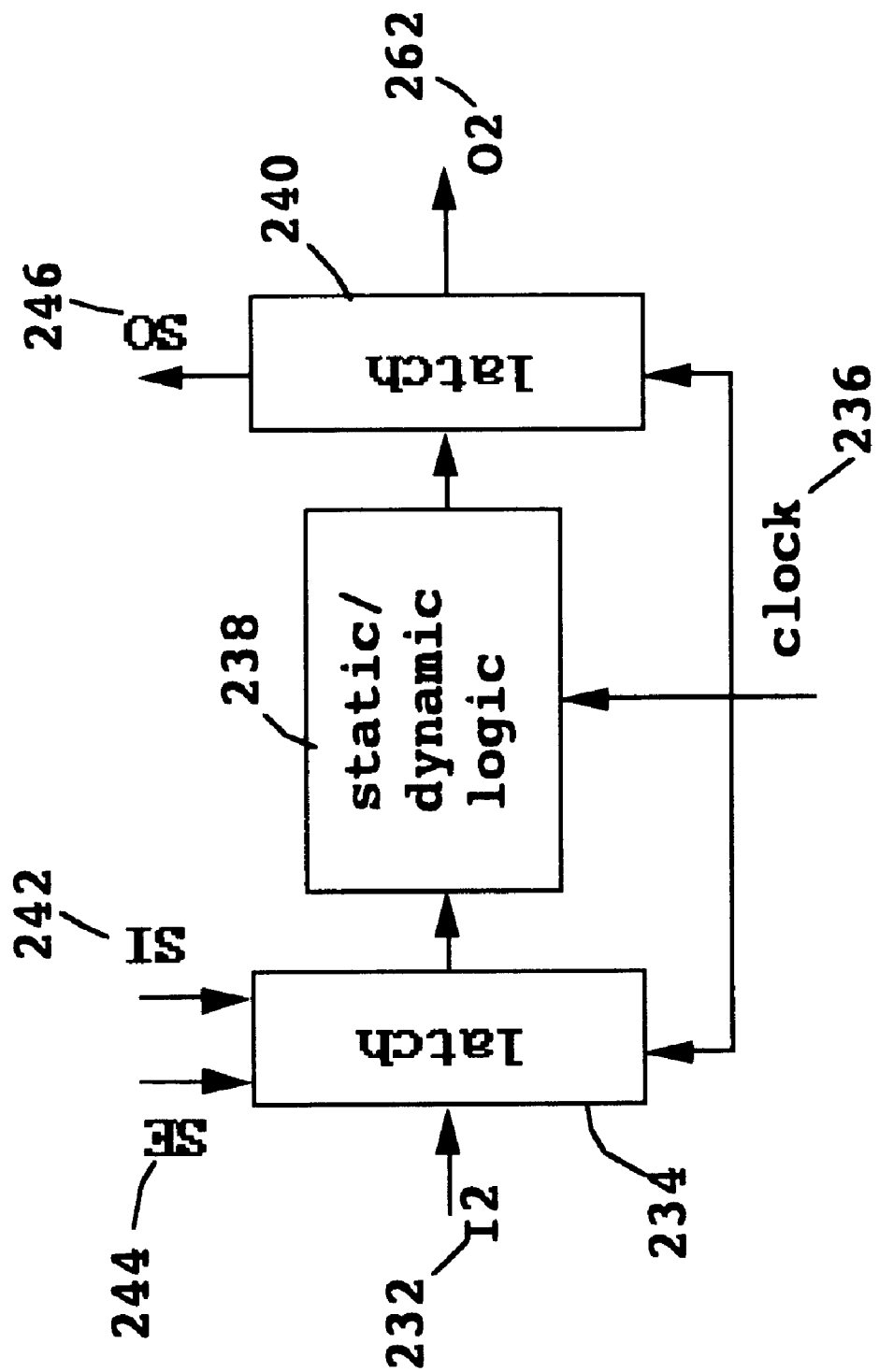
FIG. 9A shows schematic of scan-latch/register-based testing.
Figure 9B:
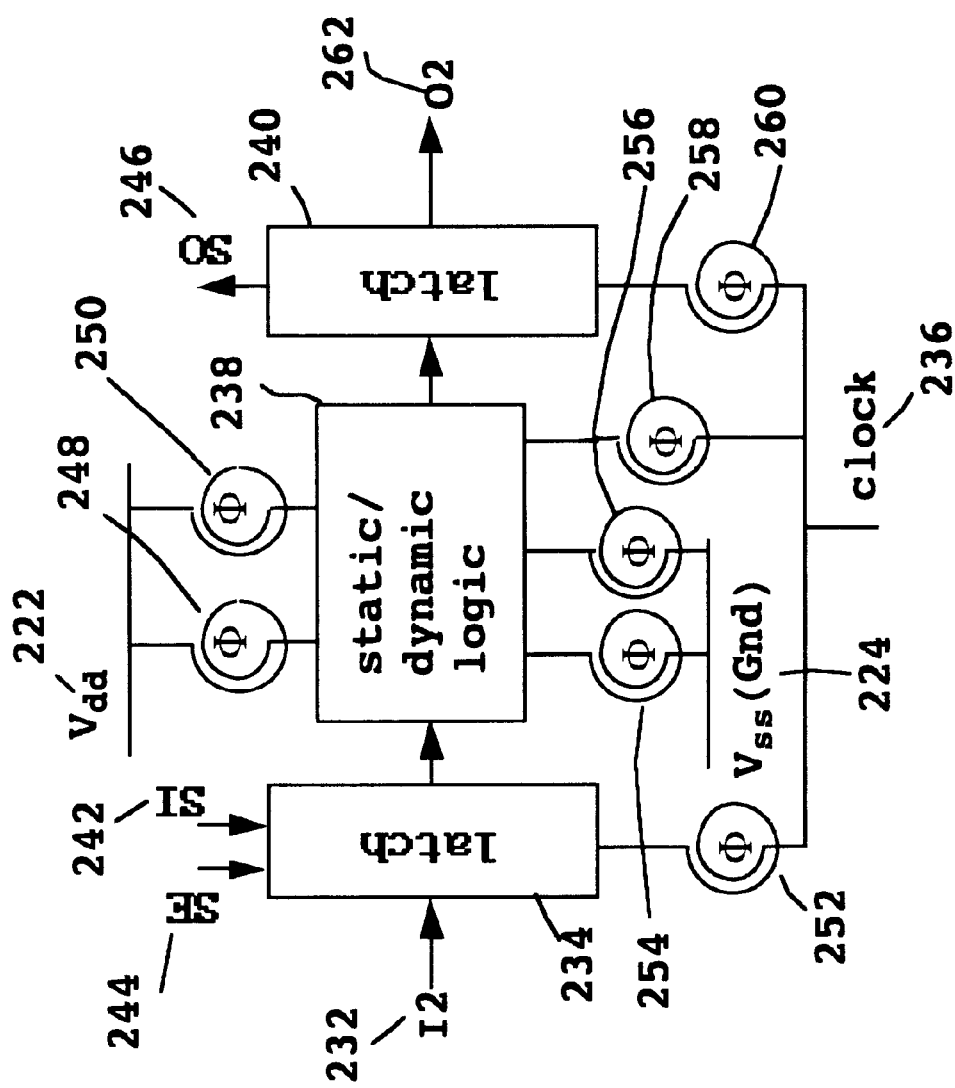
FIG. 9B shows the schematic for fully-testable logic using inductive loops and FSMs.

The observance and detection of dynamic faults is unique to FSM and can solve a variety of problems in high-speed testing. The conventional approach for testing logic circuits in a VLSI finite-state machine is shown in FIG. 9A. In normal operation, input data $I_2$ 232 is launched from the latch 234 at the rising or falling edge of the clock 236, and the results of the combinational static/dynamic logic 238 are stored in latch 240 during the next clock transition. In the test mode, the input data $I_2$ 232 may be disabled and a test vector SI 242 may be scanned into the latch 234 by asserting the scan-enable SE 244 and slowing down the clock 236. The output of the combinational static/dynamic logic 238 is stored in latch 240 and scanned out slowly as SO 246. In this method the clock, power, and ground distribution cannot be tested, and the origin of any fault within the static/dynamic logic 238 must be inferred. By introducing inductive loops 248, 250, 252, 254, 256, 258 and 260 in the clock, power, and ground connections of the static/dynamic logic 238 and the latches 234 and 240 (as is shown in FIG. 9B), all currents within the logic block may be viewed using the FSM and the circuit is fully testable under both static and dynamic conditions. Even the output signals $O_2$ 262 of the latch 240 can be detected by the method discussed below.

Figure 10A:
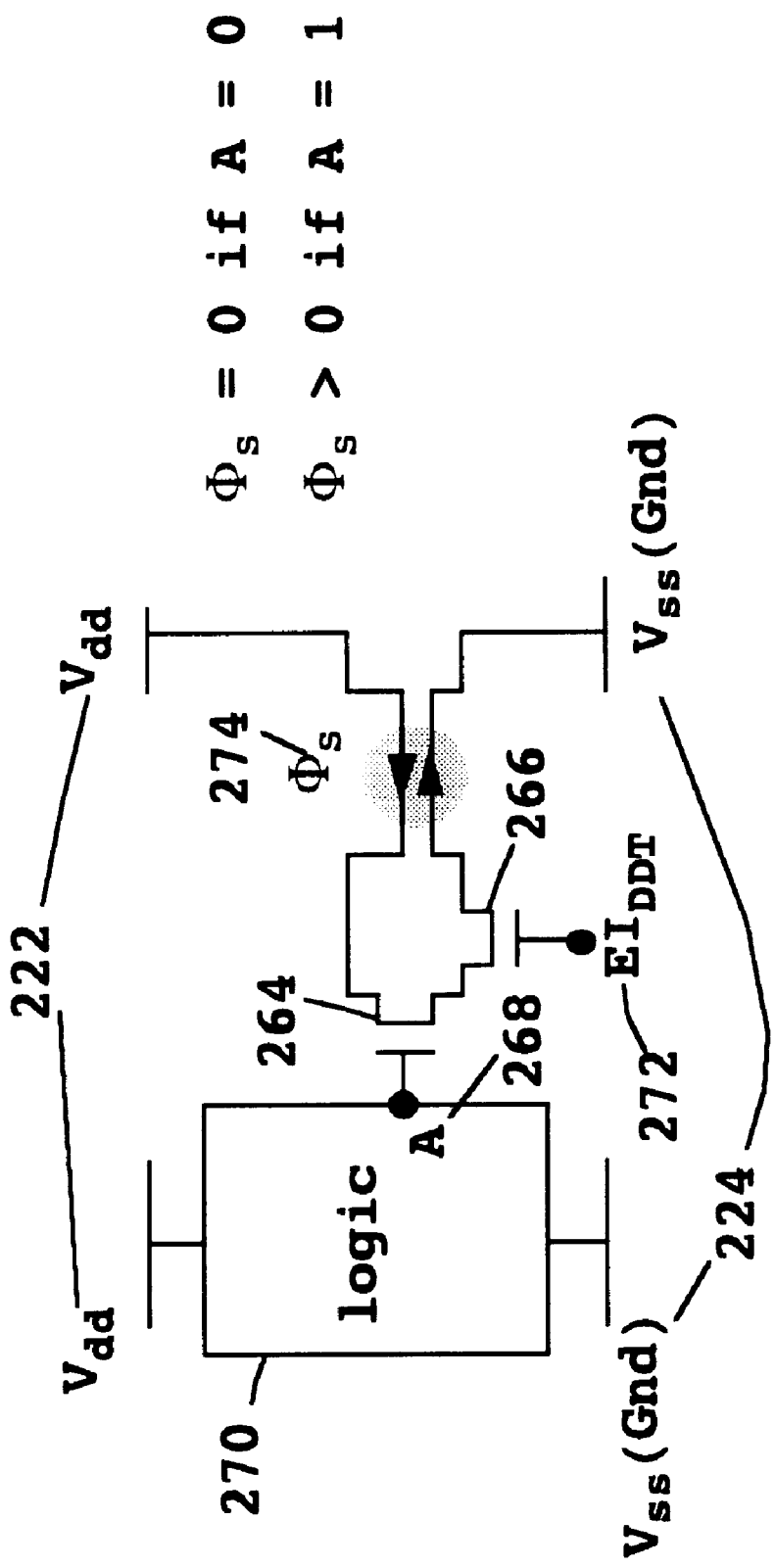
FIG. 10A shows a simple scheme for probing internal voltages of logic circuits using inductive loops and FSM
Figure 10B:
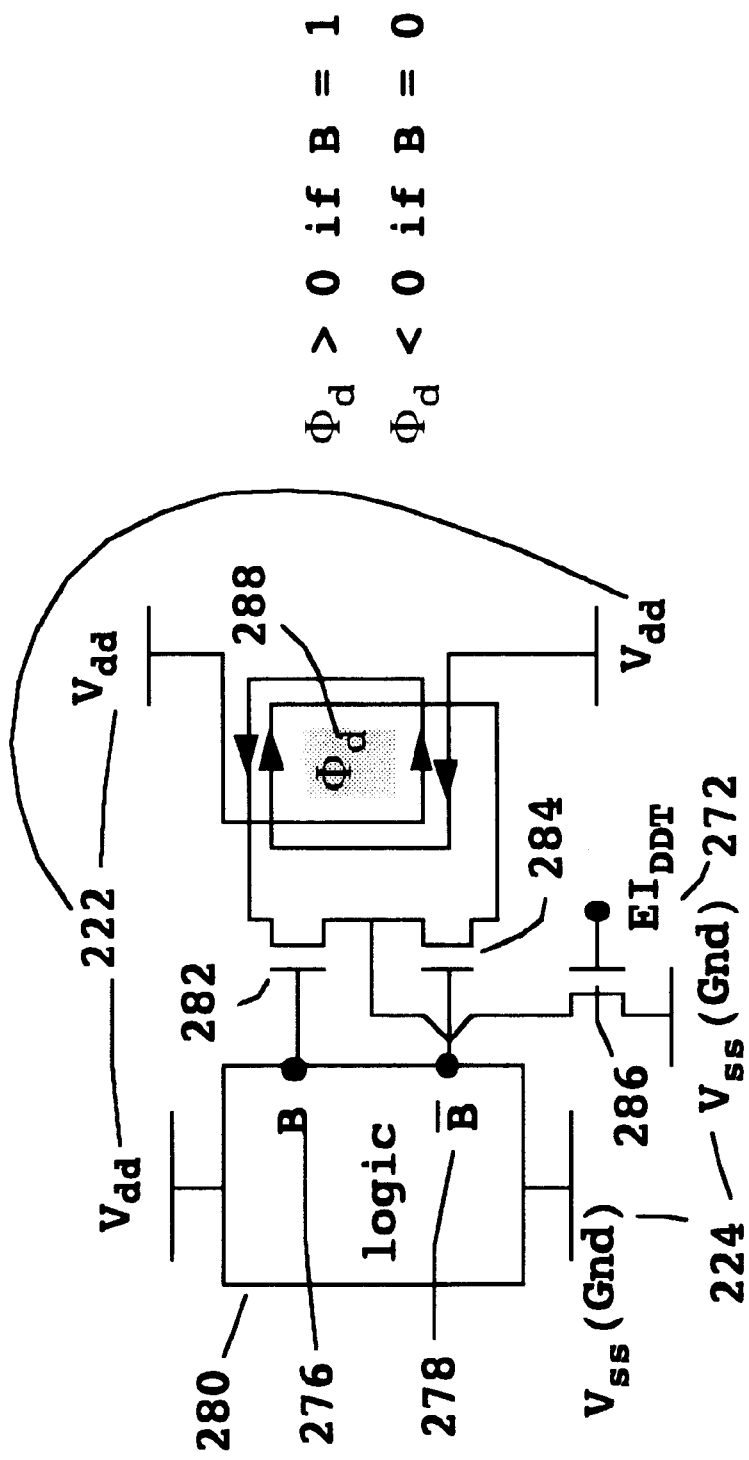
FIG. 10B shows a scheme for testing differential/complementary pair of digital signals using inductive loops and FSMs.

It is also possible to test circuits "on-the-fly" without the use of scan latches and without stopping the clock. FIG. 10A and FIG. 10B illustrate some basic voltage-to-current conversion circuits for testing single-ended and differential signals at high-speeds from random logic macros or latches. In FIG. 10A, n-channel MOSFETs 264 and 266 probe the internal node A 268 of the logic block 270. If the node A 268 was a logic "1" and the test mode is enabled by asserting a logic "1" for $EI_{DDT}$ 272, there is a small current flowing from the supply $V_{dd}$ 222 to the ground $V_{ss}$ 224. The magnetic field and flux $\Phi_s$ 274 created by this current can be detected by the FSM. If the node A was a logic "0", the n-channel MOSFET 264 would be off, and there would be no magnetic flux $\Phi_s$ 274. The MOSFETs 264 and 266 used for probing are minimum-sized and do not capacitively load the logic block. FIG. 10B shows a differential sensing scheme for complementary logic nodes B 276 and $\overline{B}$ 278 in a logic block 280. The n-channel MOSFETs 282 and 284 along with the controlled current source 286 form differential amplifier-like circuit. If the node B 276 was a logic "1" and the test mode is enabled by asserting a logic "1" for $EI_{DDT}$ 272, there is a positive magnetic flux $\Phi_d$ 288 in the inductive loop. Else if node B 276 was a logic "0", the magnetic flux $\Phi_d$ 288 in the inductive loop is negative. The ability to non-invasively probe voltages of logic nodes and drain currents of transistors at high-speed is vital to detecting at-speed timing errors through the data and control paths. It will also be easy to debug the performance of critical paths in the design while the system is functioning at speed.

Other embodiments are within the scope of the following claims. For example, the sensor 106, sampler 114, and filter 116 may be integrated monolithically. Monolithic integration of permalloy transducers and high-Tc superconductor samplers may be achieved by depositing the permalloy after fabricating the superconductor sampler. Monolithic integration is useful for gigahertz sampling because it avoids discontinuity in the transmission path between the transducer to the sampler. Monolithic integration of the sensor 106, the CMOS sampler 150, and CMOS filter 152 for the low-cost FSM also may be achieved.

The sensor 106 may be micromachined to nanoscale geometries by focussed ion beams or other microelectronic fabrication techniques. This will be important for adapting FSM to sub-100 nm CMOS technologies.

For low temperature (<150 K) probing applications where the DUT 102 is maintained at low temperature, it is possible to eliminate the MR sensor 106 and directly sense the magnetic fields by the superconducting sampler 114 in an arrangement similar to the SQUID microscopes. This reduces sampling error and complexity of the cooling assembly. The novel use of magnetoresistive transducer and time-sampling in FSM can be applied to other applications of SQUID microscopy. The magnetoresistive transducer increases the spatial resolution of these microscopes by reducing the distance between the current sources and the sensor, whereas time-sampling makes the measurements independent of the nonlinear properties of the SQUID.

The superconducting sampler 114 in the FSM can also be used in conjunction with a field-effect transistor (FET) picoprobe to sample voltages/charges/electric fields at high-speeds. The FET will act as a transducer for converting voltages/charges into currents/magnetic flux for the QFP/SQUID sampler. The feedback current $I_{fb}$ 130 is fed back to the input loop 186 of the QFP to null the net magnetic flux $\Phi$ 136 through the input loop 186 of the QFP. In conventional use, the bandwidths of the FET picoprobes are limited because the FETs have to provide sufficient voltage gain and current (for example, 10 $\mu$A) into a 50$\Omega$ load so that the sampling oscilloscope can detect the signals. If FETs are combined with the superconducting sampler, no voltage gain is required and output currents <1 $\mu$A is sufficient. This implies that the FETs can be smaller. No voltage gain implies that there is no Miller effect in the FET stage, and the FET probe can operate up to the transit frequency of the FET. FSM chips can be thus be used for both voltage and current sampling.

What is claimed is:

1. A system for measuring magnetic fields produced by an integrated circuit device-under-test, comprising:

a clock generator configured to generate a clock signal for the device-under-test;

a delay circuit connected to the clock generator and configured to generate a delayed clock signal having a known delay relative to the clock signal;

a pulse generator connected to the delay circuit and configured to generate a series of pulses having a frequency corresponding to a frequency of the clock signal, the pulses of the series of pulses being offset from the clock signal by the known delay;

a sensor having a property that varies in response to a magnetic field at the sensor;

a sampling circuit connected to the sensor and to the pulse generator, the sampling circuit being configured to measure the property of the sensor at times corresponding to pulses of the series of pulses, and to produce a sampling signal having, for each pulse, a first value when the property of the sensor indicates that the magnetic field at the sensor exceeds a threshold amount and a second value when the property of the sensor indicates that the magnetic field at the sensor does not exceed the threshold amount;

a digital filter connected to the sampling circuit and configured to produce a first indicator when a number of first values in the sampling signal exceeds a predetermined amount and to produce a second indicator when a number of first values in the sampling signal does not exceed a predetermined amount;

a counter connected to the digital filter and configured to increment an output signal in response to one of the first and second indicators and to decrement the output signal in response the other of the first and second indicators; and a feedback loop including a digital-to-analog converter connected to the counter and configured to produce an electrical signal proportional to the output signal, the electrical signal causing the feedback loop to produce a feedback magnetic field in proportion to the output signal, the feedback magnetic field being a component of the magnetic field at the sensor;

wherein the output signal corresponds to a magnetic field produced by the device-under-test.

2. The system of claim 1, wherein the series of pulses include 2N plus 1 pulses and the digital filter is configured to produce the first indicator when the sampling signal includes more than N occurrences of the first value.

3. The system of claim 1, wherein the sensor is mounted on a scanning probe configured to position the sensor relative to the device-under-test.

4. The system of claim 3, wherein the feedback loop includes a portion mounted on the scanning probe to move with the sensor and generate the feedback magnetic field at the sensor.

5. The system of claim 1, wherein the threshold value corresponds to zero magnetic flux.

6. The system of claim 1, wherein the sensor comprises a magnetoresistive sensor and the property comprises an electrical resistance that varies in response to the magnetic field at the sensor.

7. The system of claim 6, further comprising a coil connected to the sensor, wherein the sampling circuit comprises a superconductive sampling circuit configured to sense a magnetic field produced in the coil.

8. The system of claim 7, wherein the digital filter comprises a superconductive digital filter, and the superconductive sampling circuit and the superconductive digital filter operate under cryogenic conditions.

9. The system of claim 6, further comprising an amplifier connected to the sensor, wherein the sampling circuit comprises a semiconductor sampling circuit configured to sample a signal produced by the amplifier.

* * * * *